United States Patent
Ohtani

(10) Patent No.: US 7,820,486 B2
(45) Date of Patent: Oct. 26, 2010

(54) METHOD OF FABRICATING A SEMICONDUCTOR DEVICE HAVING A HEAT SINK WITH AN EXPOSED SURFACE

(75) Inventor: Katsumi Ohtani, Osaka (JP)

(73) Assignee: Panasonic Corporation, Osaka (JP)

( * ) Notice: Subject to any disclaimer, the term of this patent is extended or adjusted under 35 U.S.C. 154(b) by 59 days.

(21) Appl. No.: 12/326,462

(22) Filed: Dec. 2, 2008

(65) Prior Publication Data
US 2009/0140402 A1 Jun. 4, 2009

(30) Foreign Application Priority Data
Dec. 3, 2007 (JP) .............................. 2007-312589

(51) Int. Cl.
*H01L 21/00* (2006.01)
*H01L 23/34* (2006.01)

(52) U.S. Cl. ................ 438/113; 438/122; 438/127; 438/462; 257/713; 257/717; 257/720; 257/796; 257/E23.051; 257/E23.116; 257/E21.503

(58) Field of Classification Search ................ None
See application file for complete search history.

(56) References Cited

U.S. PATENT DOCUMENTS

| | | | |
|---|---|---|---|
| 5,736,780 A | | 4/1998 | Murayama |
| 6,246,115 B1 * | | 6/2001 | Tang et al. .................. 257/706 |
| 6,294,831 B1 | | 9/2001 | Shishido et al. |
| 6,432,749 B1 * | | 8/2002 | Libres ........................ 438/122 |
| 6,921,683 B2 * | | 7/2005 | Nakayama .................. 438/122 |
| 6,933,176 B1 * | | 8/2005 | Kirloskar et al. ............ 438/122 |

FOREIGN PATENT DOCUMENTS

| | | | |
|---|---|---|---|
| JP | 8-139223 A | 5/1996 | |
| JP | 2003-249512 A | 9/2003 | |

* cited by examiner

*Primary Examiner*—Alonzo Chambliss
(74) *Attorney, Agent, or Firm*—Hamre, Schumann, Mueller & Larson, P.C.

(57) ABSTRACT

A method includes: mounting a plurality of semiconductor elements on a substrate having wirings; connecting electrically electrodes of the semiconductor elements and the wirings; sealing the semiconductor elements with a resin, which is carried out by bringing a thermal conductor having a concavity and the substrate to be in contact with each other so that the semiconductor elements are positioned within the concavity and by filling the concavity with the resin; and separating respective semiconductor elements 1. In the resin-sealing step, in a state where the thermal conductor is arranged with its concavity facing up and the concavity of the thermal conductor is filled with a liquid resin, the semiconductor elements are dipped in the liquid resin in the concavity and the liquid resin is solidified. Due to these steps, a semiconductor device can be manufactured without experiencing troubles such as short circuit of the metal thin wires or imperfect filling of resin during the manufacturing steps, and thus semiconductor devices with stable quality can be manufactured.

24 Claims, 22 Drawing Sheets

METHOD OF FABRICATING A SEMICONDUCTOR DEVICE HAVING A HEAT SINK WITH AN EXPOSED SURFACE

BACKGROUND OF THE INVENTION

1. Field of the Invention

The present invention relates to a semiconductor device suitably used for a case in which semiconductor elements that generate much heat power are mounted, and a method for manufacturing the semiconductor device.

2. Description of Related Art

With the recent trend toward multifunction and reduction in size and thickness of electronic equipment, the semiconductor devices have become smaller and thinner, and the number of terminals tends to increase. For coping with this tendency, a so-called BGA (Ball Grid Array) package has been used. Unlike a conventional QFP (Quad Flat Package), a BGA package does not have an external lead protruding in the lateral direction. Instead, the BGA package has solder balls that are arranged in a matrix on the lower surface of a substrate and that serve as external electrodes for an electric connection with a mother board.

Since it is expected that semiconductor elements generating much heat are mounted on such a BGA package, heat diffusion is taken into consideration in the designing (see JP H08-139223 A for example).

FIG. 17 is a cross-sectional view showing a configuration of a conventional semiconductor device 101. FIG. 18 is a perspective view showing a thermal conductor 119 of the semiconductor device 101 in FIG. 17. Wiring patterns 112 are formed on the both surfaces of a substrate 113 made of an insulating resin, and the wiring patterns 112 are connected electrically to each other through via holes 117. A semiconductor element 111 is mounted on one principal surface of the substrate 113 through an adhesive 114 and connected electrically to the wiring pattern 112 on the substrate 113 through metal thin wires 115.

The thermal conductor 119 is made of a material having a preferable thermal conductivity such as Cu, Cu alloy, Al, Al alloy and Fe—Ni alloy, and it covers the surface of the substrate 113 on which the semiconductor element is mounted (semiconductor-element-mounting surface). The thermal conductor 119 has a contact portion 122 that is in contact with the substrate 113, an inclined portion 121 formed with an inclination from the contact portion 122, and a flat portion 120 formed continuously from the inclined portion 121 and to be parallel to the substrate 113. As shown in FIG. 18, a plurality of openings 131 are formed on the contact portion 122 and on the inclined portion 121. In FIG. 17, a sealing resin 116 is filled in the spacing between the thermal conductor 119 and the substrate 113 so as to seal the semiconductor-element-mounting surface of the substrate 113, the semiconductor element 111, the adhesive 114, and the metal thin wires 115 integrally. Ball electrodes 118 are arranged in a matrix on one of the wiring patterns 112 of the substrate 113 opposite to the semiconductor-element-mounting surface.

The semiconductor device 101 is configured so that heat generated by the semiconductor element 111 is diffused through the via holes 117 and the ball electrodes 118, and furthermore, the heat is diffused also from the semiconductor-element-mounting surface of the substrate 113 through the thermal conductor 119, and thus the semiconductor device 101 has excellent heat diffusion.

Furthermore, by providing a heat sink or the like (not shown) on an upper surface of the thermal conductor 119, namely, a part at which the sealing resin 116 is not formed, the effect of heat diffusion from the semiconductor-element-mounting surface can be enhanced further.

Next, a method for manufacturing the conventional semiconductor device 101 will be described below. FIGS. 19A-19F are cross-sectional views showing a process of manufacturing the semiconductor device 101. First, as shown in FIG. 19A, a substrate 113 with wiring patterns 112 formed on both surfaces thereof is prepared, and the adhesive 114 is applied on predetermined positions of the semiconductor-element-mounting surface of the substrate 113. Next, as shown in FIG. 19B, the semiconductor element 111 is placed on the adhesive 114 and adhered securely. Next, as shown in FIG. 19C, an electrode (not shown) of the semiconductor element 111 mounted on the substrate 113 and the wiring pattern 112 formed on the upper surface of the substrate 113 are connected electrically to each other through the metal thin wires 115. Next, as shown in FIG. 19D, the thermal conductor 119 is brought into contact with the substrate 113 so as to cover the semiconductor element 111.

Next, as shown in FIG. 19E, the substrate 113 in contact with the thermal conductor 119 is set on a lower mold 133 of a sealing mold 134, and sealed securely with an upper mold 132 of the sealing mold 134. At this time, the lower surface of the upper mold 132 of the sealing mold 134 and the upper surface of the thermal conductor 119 are in contact with each other. In this state, a sealing resin 116 is injected in an injection direction 136 from an injection gate 135 formed horizontally in the upper mold 132 of the sealing mold 134. As a result, through the openings 131 of the thermal conductor 119 as shown in FIG. 18, the sealing resin 116 enters the space between the thermal conductor 119 and the substrate 113. At that time, in the vicinity of the injection gate 135, the sealing resin 116 is on the upper surface of the thermal conductor 119. After curing the sealing resin 116, the upper mold 132 and the lower mold 133 of the sealing mold 134 are disengaged. Finally, as shown in FIG. 19F, the ball electrodes 118 are formed by attaching solder balls to external pad electrodes of the wiring pattern 112 formed on a surface of the substrate 113 opposite to the semiconductor-element-mounting surface, thereby configuring external terminals. In this manner, the semiconductor device 101 can be manufactured.

The conventional semiconductor device 101 can diffuse heat since the upper surface of the thermal conductor 119 is exposed from the sealing resin 116. However, since in the resin-sealing step, the resin is injected from the injection gate 135 provided at the sealing mold 134 (hereinafter, this method is referred to as a side gate method), the metal thin wires 115 will be deformed easily due to the resin injection.

Here, the deformation of the metal thin wires during the resin-sealing step in the side gate method will be described in detail with reference to FIGS. 20A-20C. FIGS. 20A-20C show a typical BGA, from which a thermal conductor is omitted for clearly showing the phenomenon.

FIG. 20A is a cross-sectional view showing a state just before a resin-sealing in the side gate method, and that corresponds to the cross-section taken along the line J-J' in FIG. 20B and FIG. 20C. FIG. 20B is a top view showing the appearance of the metal thin wires 115 before resin injection, and FIG. 20C is a top view showing the appearance of the metal thin wires 115 and a flowing pattern of the resin after the resin injection.

As shown in FIG. 20C, the resin injected from the injection gate 135 in a direction 136 moves forwards while forming ripples centering on the injection gate 135. Here, each of dotted lines 137 indicates a position the resin reaches at a point of time.

The deformation level of the metal thin wires 115 has a relationship to "resin viscosity", "resin current speed", "angle of the tip of the flowing resin with respect to the metal thin wires" and the like. As shown in FIG. 20B, the metal thin wires 115 are arranged radially from the center of the semiconductor element 111. Therefore, as shown in FIG. 20C, after the resin injection is finished, some of the metal thin wires that are located in the vicinity of the injection gate 135 or at the side diagonally opposite to the injection gate 135 and thus not angled substantially with respect to the flowing direction of the resin are not deformed substantially. However, the remaining metal thin wires 115 are deformed depending on "resin current speed", "angle of the tip of the flowing resin with respect to the metal thin wires", and the like.

As a result, in a case of resin-sealing of the conventional side gate method carried out for a semiconductor device with metal thin wires 115 arranged across at a high density in accordance with the demand for smaller device and increase in the number of terminals, problems such as a short circuit may be caused by deformation of the metal thin wires 115 when the adjacent metal thin wires 115 are arranged at a narrow pitch.

Moreover, when the thermal conductor 119 as shown in FIG. 18 is included, the flow of the sealing resin is complicated and the fluidity deteriorates. This may cause a problem of imperfect filling of the sealing resin as well as the problem of deformation of the metal thin wires.

SUMMARY OF THE INVENTION

Therefore, with the foregoing in mind, it is an object of the present invention to provide a semiconductor device with stable quality, which can be manufactured without problems such as a short circuit in the metal thin wires or imperfect resin filling during a manufacturing process. Another object of the present invention is to provide a method for manufacturing the semiconductor device.

A first method of the present invention for manufacturing a semiconductor device includes: mounting a plurality of semiconductor elements on a substrate having wirings; connecting electrodes of the semiconductor elements and the wirings electrically; sealing the semiconductor elements with a resin, which is carried out by bringing a thermal conductor having a concavity and the substrate to be in contact with each other so that the semiconductor elements are positioned within the concavity and by filling the concavity with the resin; and separating the respective semiconductor elements. For solving the above-described problems, the method is characterized in that, in the resin-sealing step, in a state where the thermal conductor is arranged with its concavity facing up and the concavity of the thermal conductor is filled with a liquid resin, the semiconductor elements are dipped in the liquid resin in the concavity and subsequently the liquid resin is solidified.

A second method of the present invention for manufacturing a semiconductor device includes: mounting a plurality of semiconductor elements on a lead frame; connecting electrodes of the semiconductor elements and the lead frame electrically; sealing the semiconductor elements with a resin, which is carried out by bringing a thermal conductor having a concavity and the lead frame to be in contact with each other so that the semiconductor elements are positioned within the concavity and by filling the concavity with the resin; and separating the respective semiconductor elements. For solving the above-described problem, the method is characterized in that, in the resin-sealing step, in a state where the thermal conductor is arranged with its concavity facing up and the concavity of the thermal conductor is filled with the resin, the semiconductor elements are dipped in the liquid resin in the concavity and the liquid resin is solidified.

A first semiconductor device of the present invention includes a semiconductor element, a substrate on which the semiconductor element is mounted, a thermal conductor, and a sealing resin that is provided into the spacing between the substrate and the thermal conductor so as to seal the semiconductor element. For solving the above-described problem, the thermal conductor is bonded to the surface of the sealing resin so as to cover the sealing resin.

A second semiconductor device of the present invention includes a semiconductor element, a lead frame on which the semiconductor element is mounted, a thermal conductor, and a sealing resin that is provided into the spacing between the lead frame and the thermal conductor so as to seal the semiconductor element. For solving the above-described problem, the thermal conductor is bonded to the surface of the sealing resin so as to cover the sealing resin.

DETAILED DESCRIPTION OF THE INVENTION

Figure 1A:
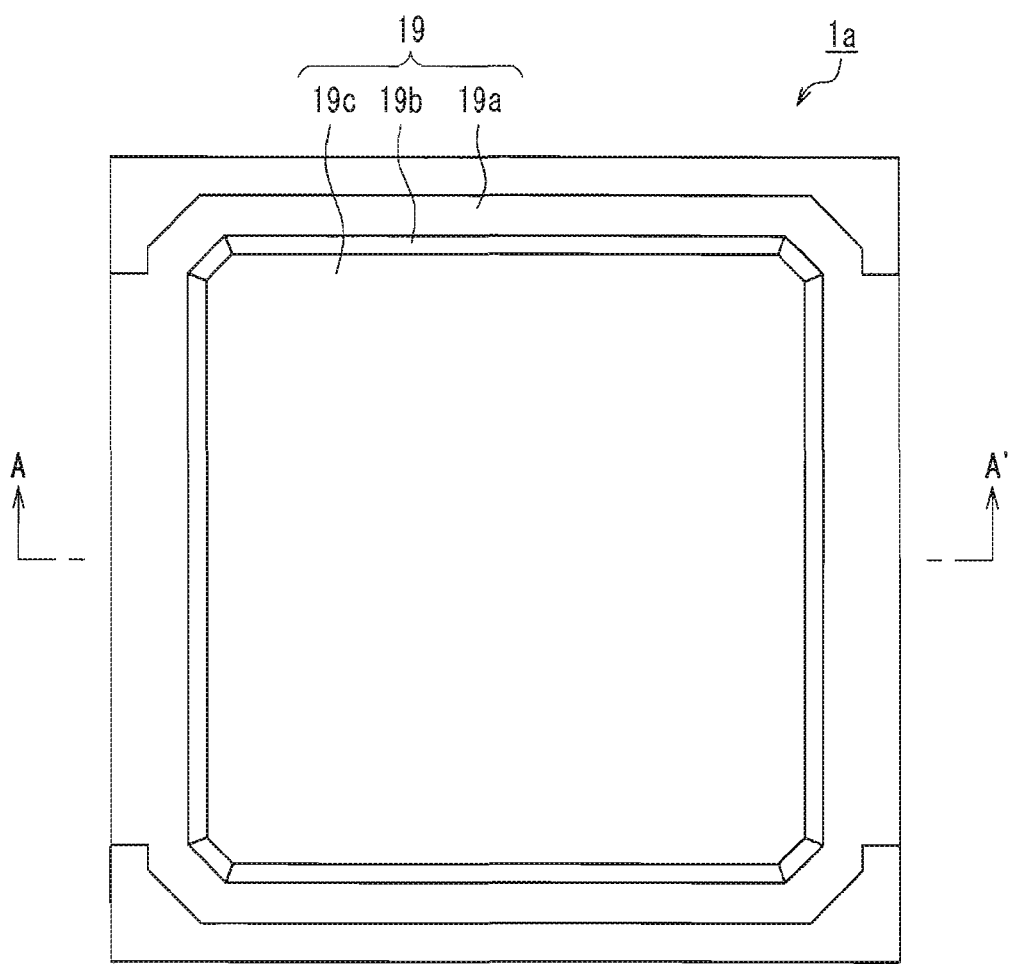
FIG. 1A is a top view showing a configuration of a semiconductor device according to Embodiment 1 of the present invention.

A first method of the present invention for manufacturing a semiconductor device is characterized in that, in a resin-sealing step, in a state where a thermal conductor is arranged with its concavity facing up and the concavity of the thermal conductor is filled with a liquid resin, a plurality of semiconductor elements arranged on a substrate are dipped in the liquid resin in the concavity and the liquid resin is solidified. According to this manufacturing method, since the metal thin wires of the semiconductor device will not be shorted during the manufacturing process, and furthermore, since a problem of imperfect filling of resin will not occur, semiconductor devices with stable quality can be manufactured.

A second method of the present invention for manufacturing a semiconductor device is characterized in that, in a resin-sealing step, in a state where a thermal conductor is arranged with its concavity facing up and the concavity of the thermal conductor is filled with a liquid resin, a plurality of semiconductor elements arranged on a lead frame are dipped in the liquid resin in the concavity and the liquid resin is solidified. According to this manufacturing method, since the metal thin wires of the semiconductor device will not be shorted during the manufacturing process, and furthermore, since a problem of imperfect filling of resin will not occur, semiconductor devices with stable quality can be manufactured.

A first semiconductor device of the present invention includes a semiconductor element, a substrate on which the semiconductor element is mounted, a thermal conductor, and a sealing resin that is provided to the spacing between the substrate and the thermal conductor so as to seal the semiconductor element. The thermal conductor is bonded to the surface of the sealing resin so as to cover the sealing resin.

A second semiconductor device of the present invention includes a semiconductor element, a lead frame on which the semiconductor element is mounted, a thermal conductor, and a sealing resin that is provided to the spacing between the lead frame and the thermal conductor so as to seal the semiconductor element. The thermal conductor is bonded to the surface of the sealing resin so as to cover the sealing resin.

Based on the above-described configurations, the semiconductor device and the method for manufacturing the semiconductor device of the present invention can be varied as described below.

Namely, in the first method for manufacturing a semiconductor device, the state where the concavity of the thermal conductor is filled with a liquid resin can be obtained by injecting the liquid resin into the concavity of the thermal conductor.

Alternatively, the state where the concavity of the thermal conductor is filled with a liquid resin can be obtained by casting a solid resin into the concavity of the thermal conductor and by heating the thermal conductor so as to melt the solid resin.

The thermal conductor before the separation step can be provided as a group of joined thermal conductors, and the separation step can be carried out by cutting the substrate and the thermal conductor group simultaneously.

The thermal conductor before the separation step can be provided as a group of joined thermal conductors, and the separation step can be carried out by cutting the substrate, the thermal conductor group and the sealing resin simultaneously.

In the second method for manufacturing a semiconductor device, the state where the concavity of the thermal conductor is filled with a liquid resin can be obtained by injecting the liquid resin into the concavity of the thermal conductor.

Alternatively, the state where the concavity of the thermal conductor is filled with a liquid resin can be obtained by casting a solid resin into the concavity of the thermal conductor and by heating the thermal conductor so as to melt the solid resin.

The thermal conductor before the separation step can be provided as a group of joined thermal conductors, and the separation step can be carried out by cutting the lead frame and the thermal conductor group simultaneously.

The thermal conductor before the separation step can be provided as a group of joined thermal conductors, and the separation step can be carried out by cutting the lead frame, the thermal conductor group and the solidified resin simultaneously.

In the first and second methods of manufacturing a semiconductor device, the resin-sealing step can be carried out by sealing a plurality of semiconductor elements simultaneously.

The thermal conductor group can include the thermal conductors formed in a strip. Alternatively, the thermal conductor group can include the thermal conductors formed in a matrix. It is also possible that slits are formed at the joints between the thermal conductors of the thermal conductor group.

In the first semiconductor device, the thermal conductor can be configured to cover the entire surface of the sealing resin. Alternatively, it is possible that the sealing resin is exposed from the surface composed of the side face of the substrate and also the side face of the thermal conductor.

It is also possible that the sealing resin is exposed from two side-faces opposed to each other. Alternatively, the sealing resin can be exposed from all of the side faces.

The electrode of the semiconductor element and the wirings of the substrate can be connected electrically to each other by the metal thin wires. Alternatively, the electrode of the semiconductor element and the wirings of the substrate can be connected electrically via bumps.

The surface of the semiconductor element opposite to the surface on which a circuit is formed can be configured to be in contact with the thermal conductor.

In the second semiconductor device, the thermal conductor can be configured to cover the entire surface of the sealing resin. Alternatively, the sealing resin can be exposed from the surface composed of the side face of the lead frame and the side face of the thermal conductor.

It is also possible that the sealing resin is exposed from two side-faces opposed to each other. Alternatively, the sealing resin can be exposed from all of the side faces.

Alternatively, the thermal conductor can be adhered to the lead frame through an insulating adhesive member.

Embodiment 1

A configuration of a semiconductor device according to Embodiment 1 of the present invention will be described below. FIG. 1 includes views for showing the configuration of a semiconductor device 1a in Embodiment 1 of the present invention. FIG. 1A is a top view of the semiconductor device 1a, and FIG. 1B is a cross-sectional view taken along the line A-A in FIG. 1A.

Figure 1B:
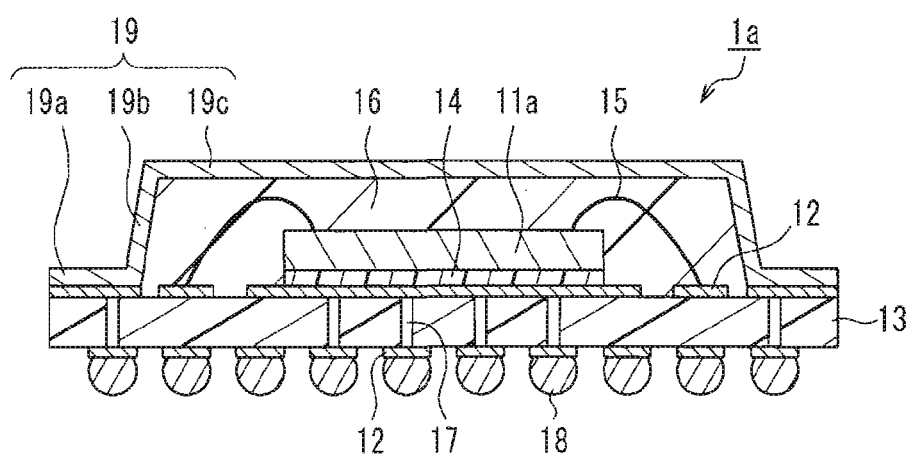
FIG. 1B is a cross-sectional view taken along the line A-A in FIG. 1A.

As shown in FIG. 1B, wiring patterns 12 are formed on both surfaces of a substrate 13 made of an insulating resin. The wiring patterns 12 are connected electrically to each other through via holes 17. A semiconductor element 11a is adhered to the substrate 13 through an adhesive 14. An electrode is formed on the upper surface of the semiconductor element 11a and connected to the wiring pattern 12 through metal thin wires 15. A sealing resin 16 seals integrally the semiconductor-element-mounting surface of the substrate 13, the semiconductor element 11a, the adhesive 14 and the metal thin wires 15.

Figure 18:
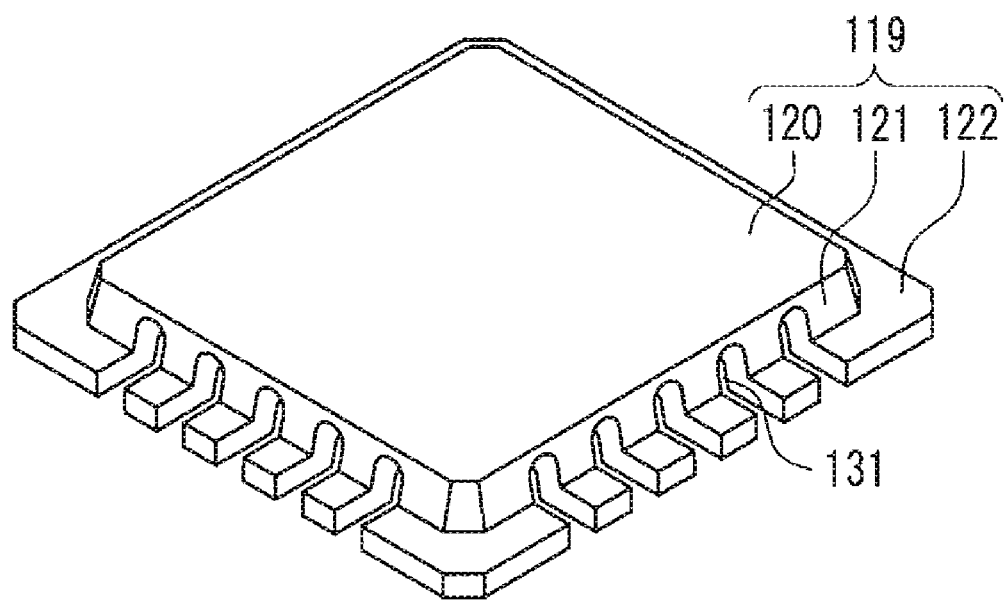
FIG. 18 is a perspective view showing a thermal conductor of the semiconductor device.

A thermal conductor 19 is made of a material having preferable thermal conductivity, such as Cu, Cu alloy, Al, Al alloy, and Fe—Ni alloy. The thermal conductor 19 is shaped like a hat, and it has a contact portion 19a, an inclined portion 19b formed with an inclination from the contact portion 19a, and a flat portion 19c formed continuously from the inclined portion 19b and in parallel to the contact portion 19a. That is, the thermal conductor 19 has a concavity defined by the inclined portion 19b and the flat portion 19c. The contact portion 19a is in contact with the substrate 13, and the concavity is bonded to the sealing resin 16 to cover the sealing resin 16. The thermal conductor 19 can be in contact with the substrate 13 and further adhered securely to the substrate 13 with an adhesive (not shown) or the like. The openings 131 as shown in FIG. 18 are not formed in the thermal conductor 19.

The flat portion 19c of the thermal conductor 19 is exposed entirely or partially from the sealing resin 16 to the exterior. Ball electrodes 18 are arranged in a matrix on a surface (ball-formation surface) of the substrate 13 opposite to the semiconductor-element-mounting surface, and connected electrically to the wiring pattern 12 of the substrate 13.

In the configuration of the semiconductor device 1a, the heat generated by the semiconductor element 11a is diffused through the via holes 17 and the ball electrodes 18, and furthermore the heat is diffused also from the semiconductor-element-mounting surface of the substrate 13 through the thermal conductor 19. Therefore, the semiconductor device 1a has excellent heat diffusion. Since the exterior of the thermal conductor is not provided with a sealing resin, the heat diffusion efficiency is improved further. Furthermore, by providing a heat sink or the like (not shown) on the part at which the thermal conductor 19 is exposed from the sealing resin 16, the effect of heat diffusion of the substrate 13 from the semiconductor-element-mounting surface can be improved further.

Unlike a conventional configuration, in the semiconductor device according to this embodiment, there is no necessity of forming openings in the thermal conductor for the purpose of injecting a sealing resin, and thus the effect of suppressing electromagnetic noise received or emitted by the semiconductor device will be improved.

Next, a method for manufacturing the semiconductor device 1a according to the present embodiment will be described below. FIGS. 2A-2F are cross-sectional views showing a process for manufacturing the semiconductor device 1a.

Figure 2A:
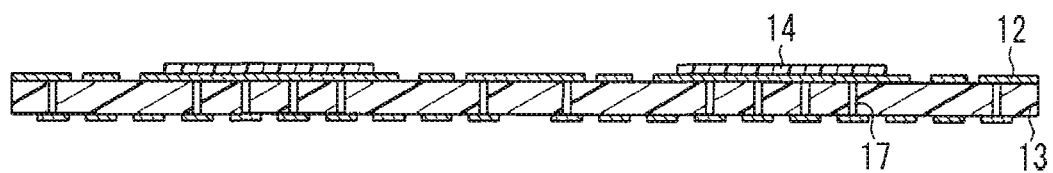
FIGS. 2A-2F are cross-sectional views showing a process of manufacturing the semiconductor device.
Figure 2B:
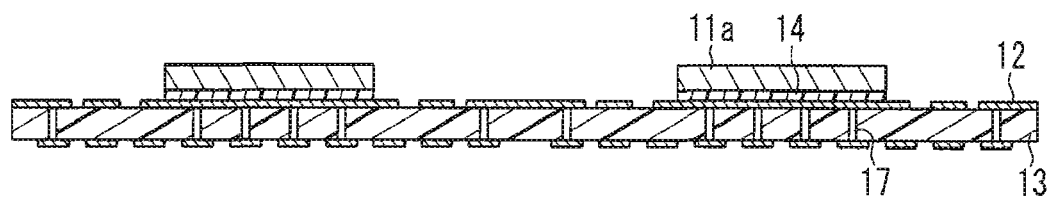
Figure 2C:
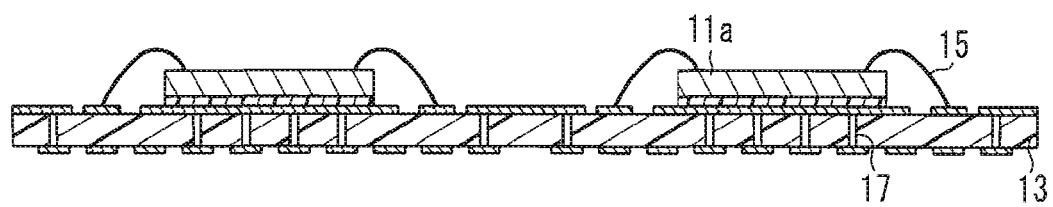
Figure 19A:
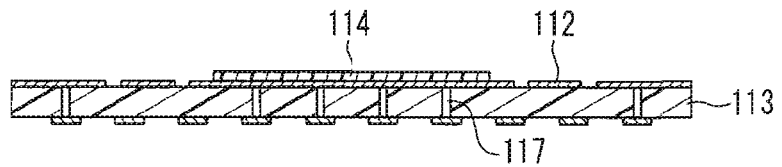
FIGS. 19A-19F are cross-sectional views showing a process of manufacturing the semiconductor device.
Figure 19B:
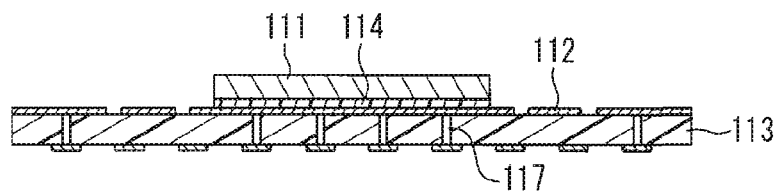
Figure 19C:
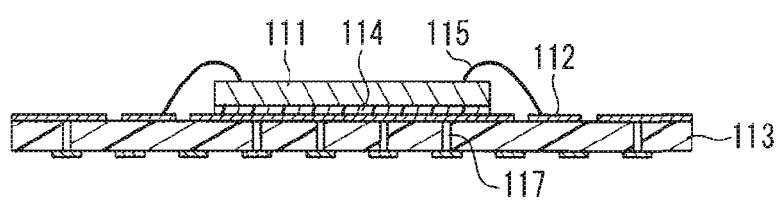

First, as shown in FIG. 2A, a substrate 13 having wiring patterns 12 formed on both the surfaces is prepared, and an adhesive 14 is applied on the predetermined positions of semiconductor-element-mounting surface of the substrate 13. Next, as shown in FIG. 2B, semiconductor elements 11a are arranged on the adhesive 14 applied on the predetermined positions of the substrate 13 and adhered securely. Next, as shown in FIG. 2C, electrodes (not shown) of the semiconductor elements 11a mounted on the substrate 13 are connected electrically to electrodes of the wiring patterns 12 formed on the semiconductor-element-mounting surface of the substrate 13 through the metal thin wires 15. The processes by this step are common to those in the method for manufacturing the conventional semiconductor device 101 as shown in FIGS. 19A-19C.

Figure 2D:
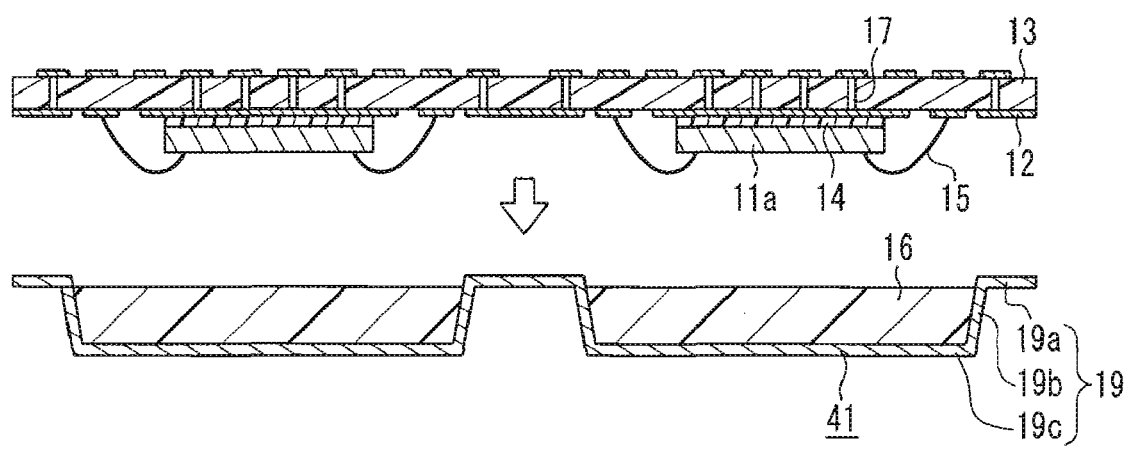

Next, a thermal conductor group 41 as shown in FIG. 2D is prepared by integrally forming a plurality of thermal conductors 19. The thermal conductor group 41 is formed by etching or pressing a metal plate made of a material having a preferable thermal conductivity, such as Cu, Cu alloy, Al, Al alloy and Fe—Ni alloy so as to form concavities integrally. The shape of the thermal conductor 19 is not limited to the quadrangle as shown in the present embodiment, but it may be round or polygonal.

Figure 3:
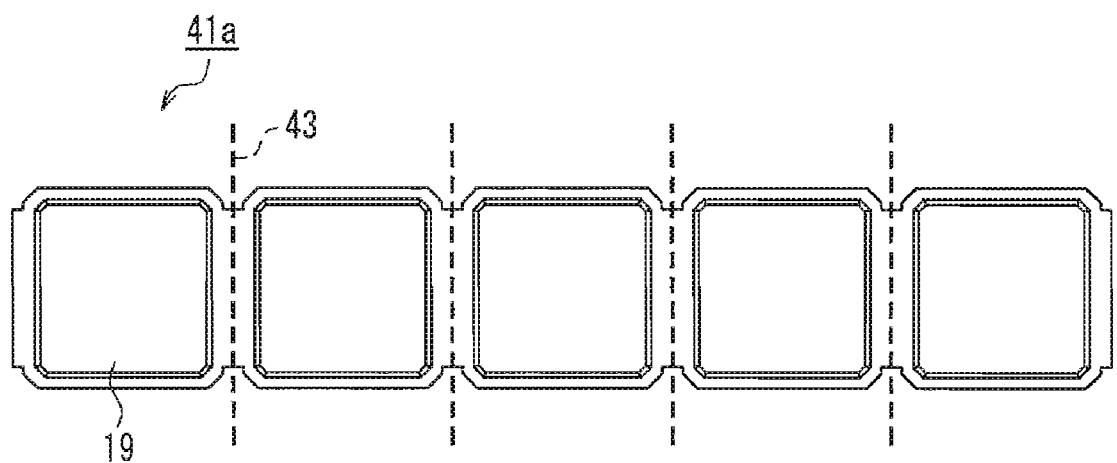
FIG. 3 is a plan view showing a thermal conductor group for the semiconductor device.

FIG. 3 is a top view showing the thermal conductor group 41a formed by aligning and integrating a plurality of thermal conductors 19. The thermal conductor group 41a includes the thermal conductors 19 formed in a line in accordance with the pitch for mounting the semiconductor elements with respect to the substrate on which the semiconductor elements will be mounted. The cutoff line 43 indicates a line along which the thermal conductor group 41 is cut and separated to form a plurality of thermal conductors 19.

Figure 4:
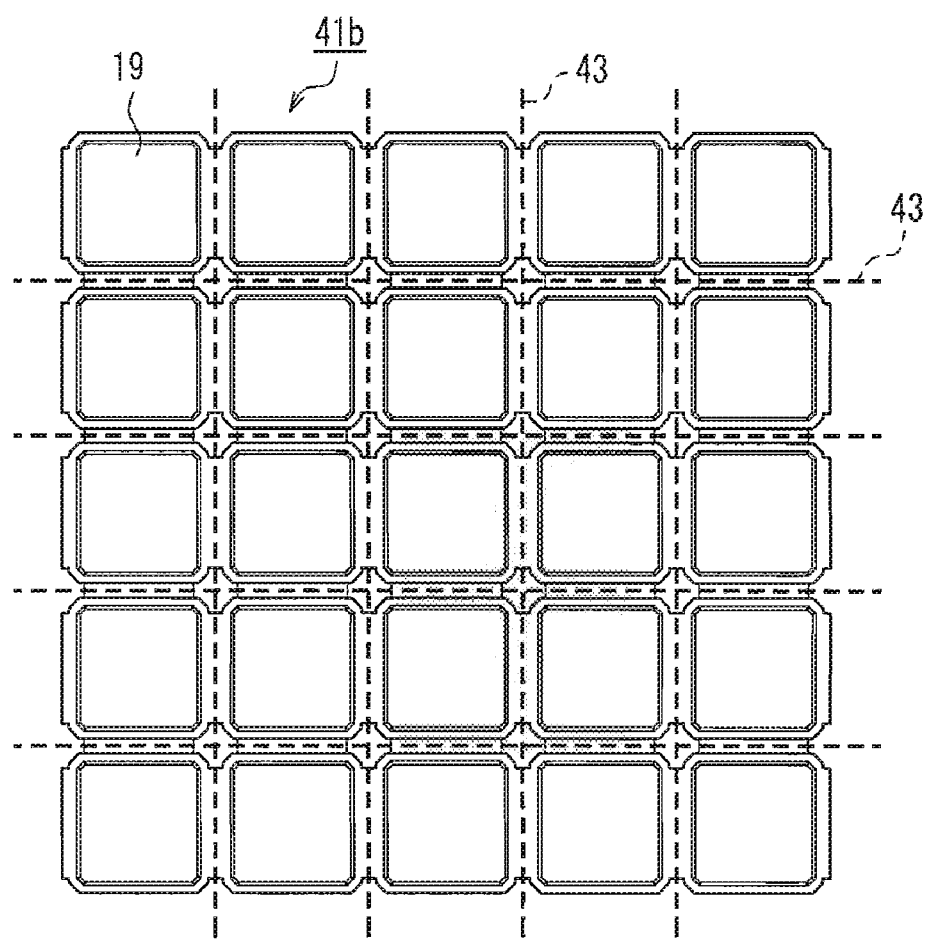
FIG. 4 is a plan view showing a thermal conductor group for the semiconductor device.

FIG. 4 is a top view showing a thermal conductor group 41b formed by integrating a plurality of thermal conductors 19 arranged in a matrix. The thermal conductor group 41b includes the thermal conductors 19 formed in a matrix in accordance with the pitch for mounting the semiconductor elements with respect to the substrate 13 on which the semiconductor elements 11a will be mounted. It is possible to seal a plurality of semiconductor elements 11a simultaneously by using the thermal conductor group 41a or 41b.

Figure 5:
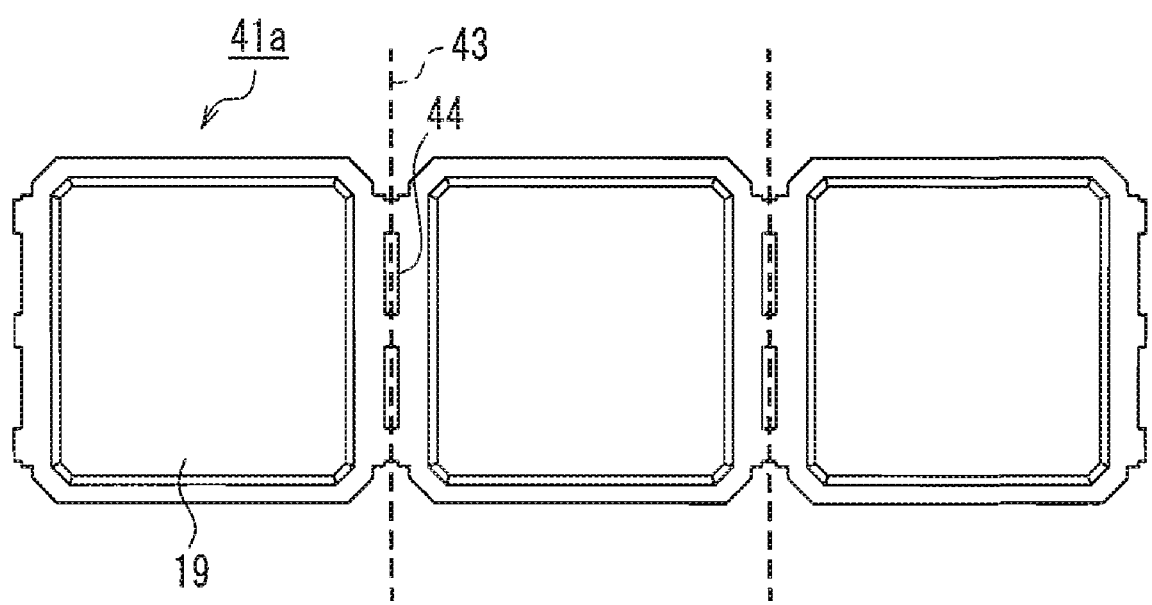
FIG. 5 is a plan view showing a thermal conductor group for the semiconductor device.

FIG. 5 is an enlarged top view of a part of the thermal conductor group 41a. In the thermal conductor group 41a, slits 44 are formed along the cutoff line 43 for easy cutting.

Next, as shown in FIG. 2D, the sealing resin 16 is injected into the concavity of the thermal conductor group 41 in a state where the thermal conductor group 41 is set so that the surface facing the semiconductor elements 11a is turned upward (i.e., the concavity is faced up). At this time, for the sealing resin 16, a liquid resin is injected. Alternatively, a solid resin is cast and heated to be melted in the concavity of the thermal conductor group 41. Here, the semiconductor-element-mounting surface of the substrate 13 is turned downward, and the contact portion 19a of the thermal conductor 19 is brought into contact with the substrate 13 while dipping the semiconductor element 11*a* in a liquid sealing resin 16, and thus a resin-sealing is carried out.

Figure 19D:
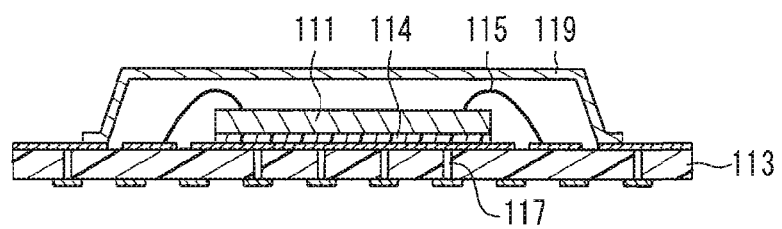
Figure 19E:
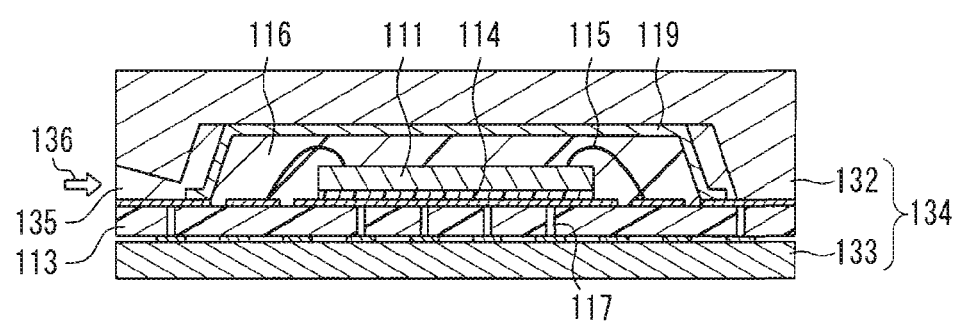
Figure 19F:
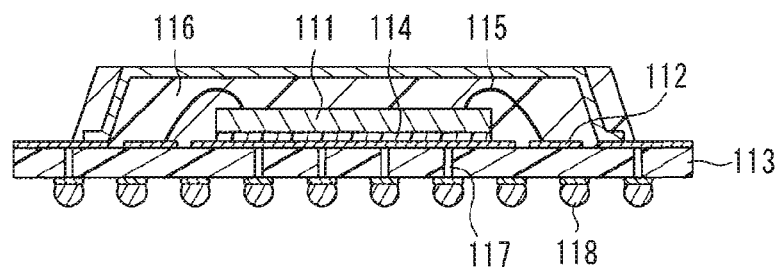
Figure 20A:
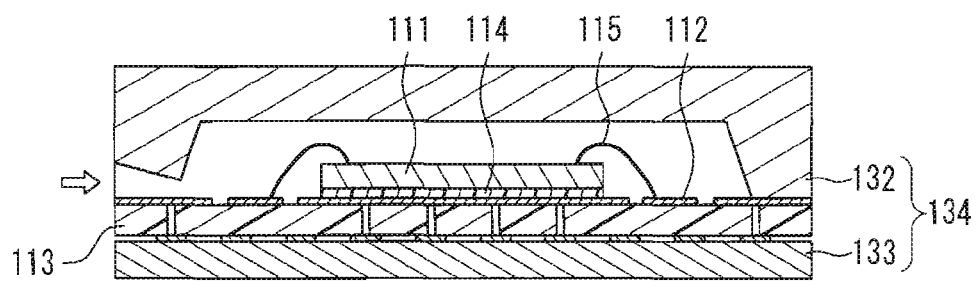
FIG. 20A is a cross-sectional view showing a state before resin injection, in a process of manufacturing a conventional semiconductor device.
Figure 20B:
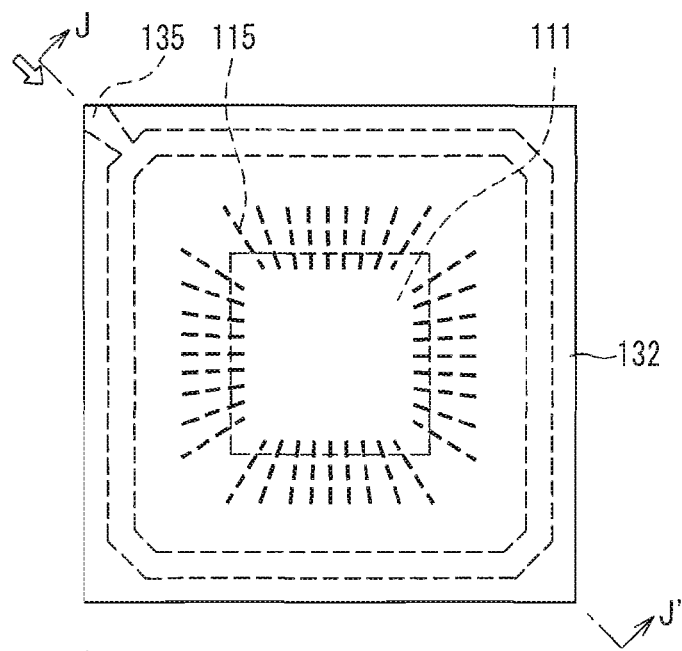
FIG. 20B is a top view showing a state before resin injection, in a process of manufacturing the semiconductor device.
Figure 20C:
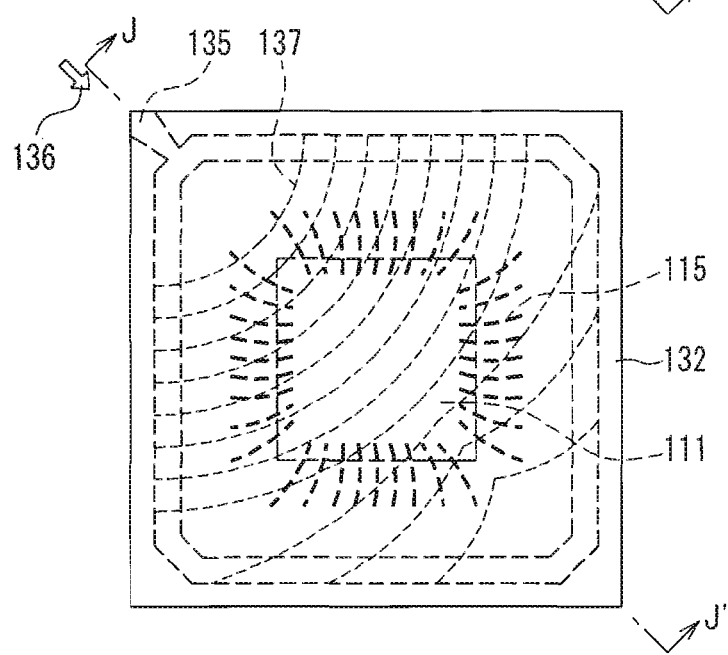
FIG. 20C is a top view showing a state after resin injection, in a process of manufacturing the semiconductor device.

In this process where the thermal conductor group 41 is employed in place of the mold 134 used in the sealing step in the method for manufacturing a conventional semiconductor device as shown in FIG. 19D, the steps shown in FIGS. 19D and 19E are combined into the step as shown in FIG. 2D, thereby decreasing the number of steps. Moreover, a resin-sealing can be carried out without using an expensive mold. In addition, unlike the resin-sealing step included in the side gate method, a resin will flow less. And thus problems such as deformation of the metal thin wires 15 can be suppressed.

Figure 2E:
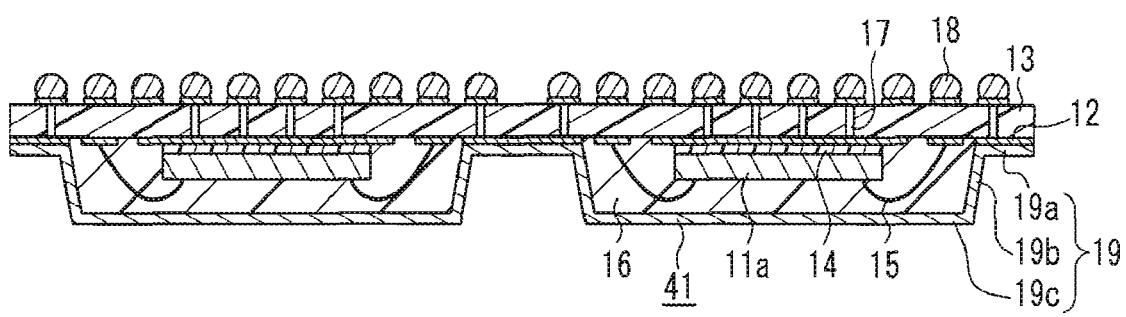
Figure 2F:
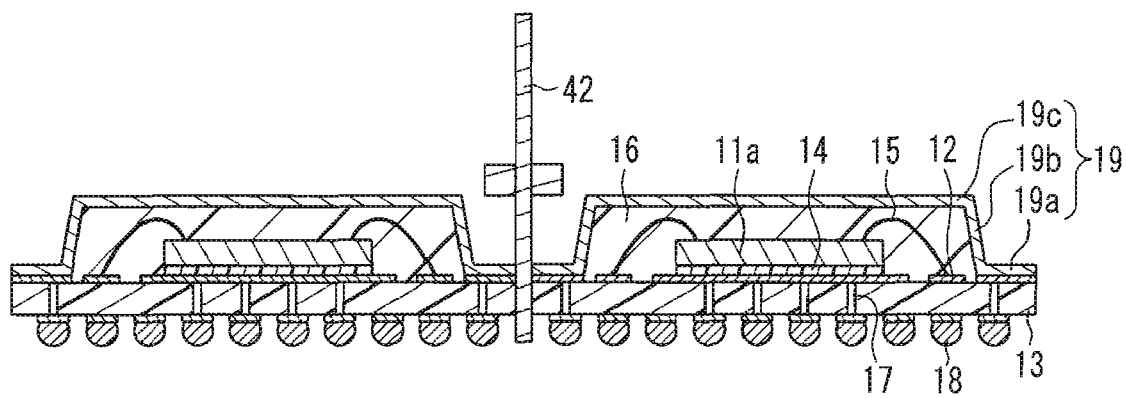

Next, as shown in FIG. 2E, the ball electrodes 18 are formed in a matrix in accordance with the wiring pattern 12 formed on the ball-formation surface of the substrate 13. Finally, as shown in FIG. 2F, the components are separated by cutting with a rotary blade 42 for each of the semiconductor elements 11*a*. In this manner, the semiconductor device 1*a* as shown in FIG. 1 can be manufactured. When the thermal conductor group 41 and the substrate 13 are cut with the rotary blade 42, metal chips of the thermal conductor group 41 are generated. However, since the slits 44 are formed in the thermal conductor group 41 along the cutoff line 43, the amount of the metal chips can be decreased. As a result, adhesion of the metal chips to the semiconductor device 1*a* is reduced.

Figure 6A:
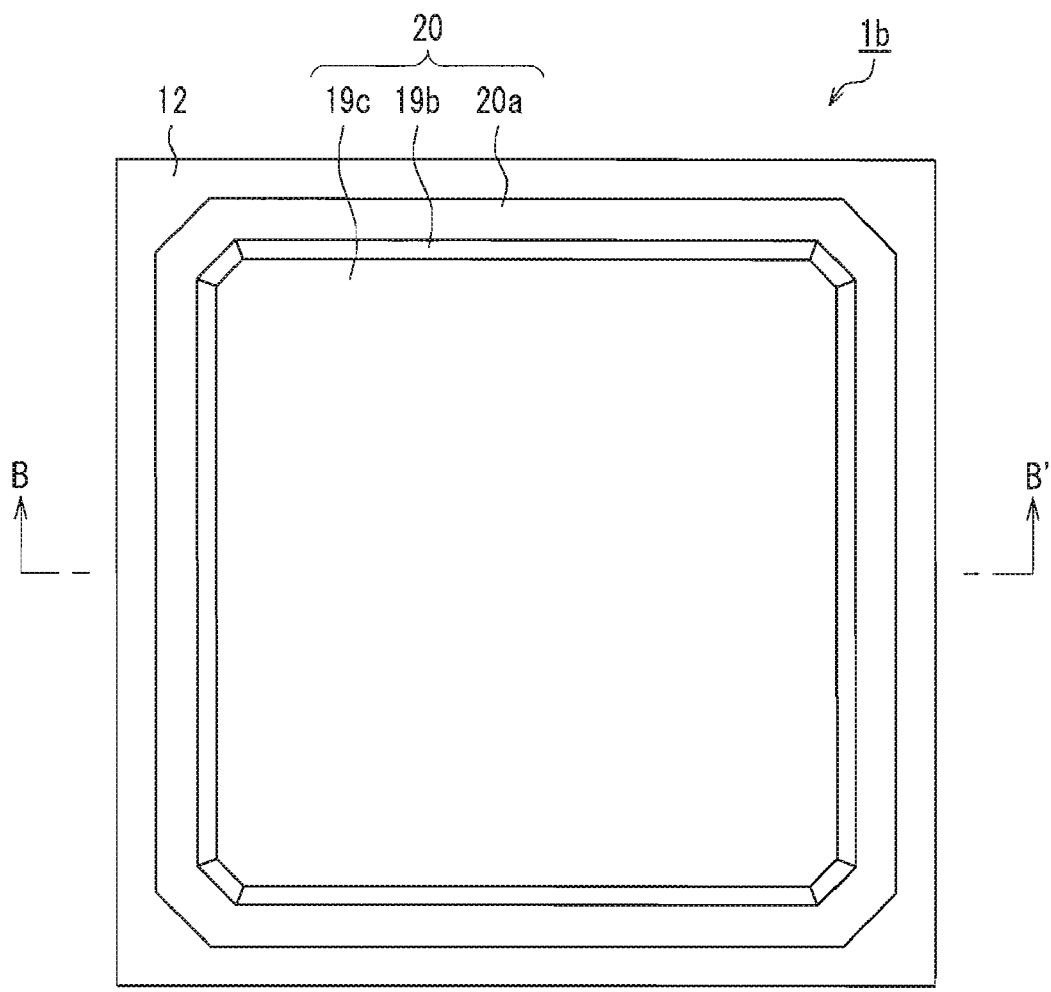
FIG. 6A is a top view showing a variation of the semiconductor device.
Figure 6B:
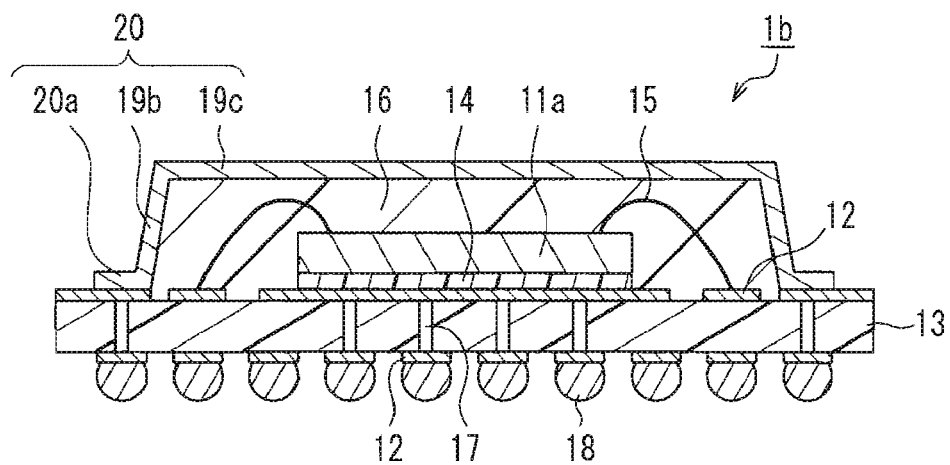
FIG. 6B is a cross-sectional view taken along the line B-B' in FIG. 6A.

FIG. 6A is a top view showing a semiconductor device 1*b* as a variation of the semiconductor device 1*a*. FIG. 6B is a cross-sectional view taken along the line B-B' in FIG. 6A. The contact portion 20*a* does not reach the rim of the substrate 13, and it is not connected to a thermal conductor adjacent to the thermal conductor 20 in the manufacturing process. By using this thermal conductor 20, metal chips can be reduced at the time of separating the semiconductor devices, and thus adhesion of the metal chips to the semiconductor device can be reduced.

Embodiment 2

Figure 7A:
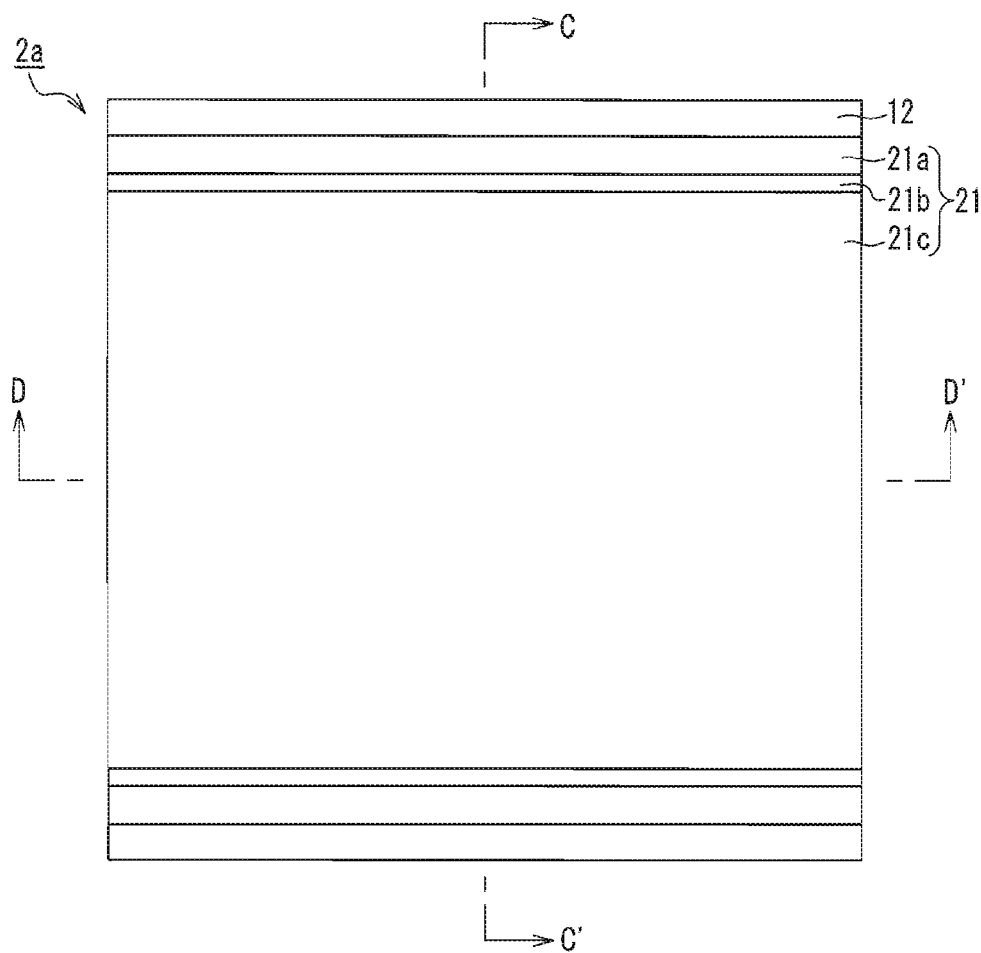
FIG. 7A is a top view showing a configuration of a semiconductor device according to Embodiment 2 of the present invention.
Figure 7B:
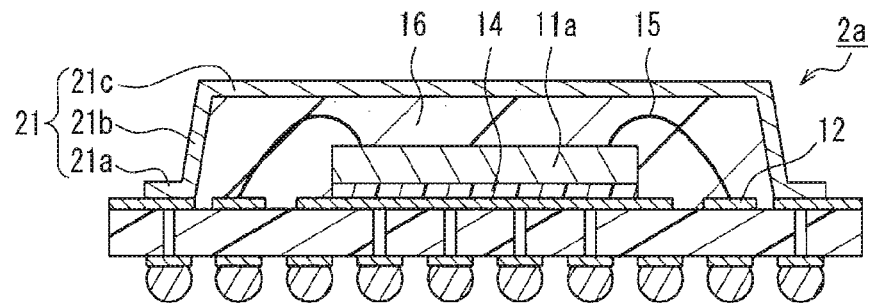
FIG. 7B is a cross-sectional view taken along the line C-C' in FIG. 7A.
Figure 7C:
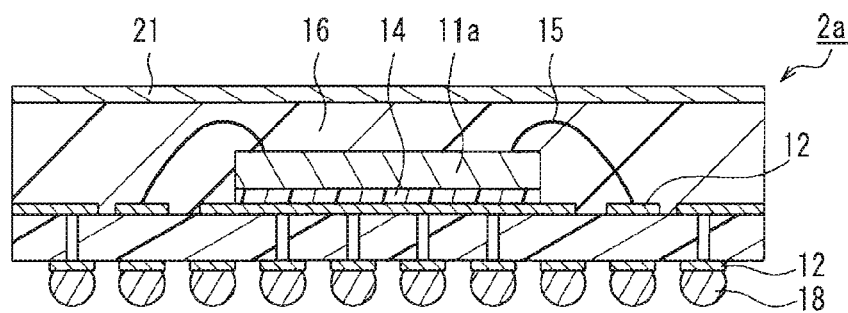
FIG. 7C is a cross-sectional view taken along the line D-D' in FIG. 7A.

A semiconductor device according to Embodiment 2 of the present invention will be described below. FIG. 7A is a top view showing the configuration of a semiconductor device 2*a* in the present embodiment. FIG. 7B is a cross-sectional view taken along the line C-C' in FIG. 7A. FIG. 7C is a cross-sectional view taken along the line D-D' that is perpendicular to the line C-C' in FIG. 7A. In the following description of embodiment, the same reference numerals may be assigned to the same components as those of the semiconductor device 1*a* in Embodiment 1 in order to avoid the duplication of explanations.

The thermal conductor 21 shown in FIG. 7B is made of a material having a preferable thermal conductivity, such as Cu, Cu alloy, Al, Al alloy and Fe—Ni alloy. The thermal conductor 21 includes a contact portion 21*a*, an inclined portion 21*b* formed with an inclination from the contact portion 21*a*, and a flat portion 21*c* formed continuously from the inclined portion 21*b* and in parallel to the contact portion 21*a*. The inclined portion 21*b* and the flat portion 21*c* define a concavity. The contact portion 21*a* is in contact with the substrate 13, and the concavity is bonded to the surface of the sealing resin 16 so as to cover the sealing resin 16. The thermal conductor 21 covers not the entire surface of the sealing resin 16, but as shown in FIG. 7C, the sealing resin 16 is exposed along the cross section of the separated semiconductor device at the both ends of the line D-D' of the semiconductor device 2*a*. The thermal conductor 21 can be in contact with the substrate 13 and furthermore adhered securely to the substrate 13 with an adhesive (not shown) or the like. The flat portion 21*c* of the thermal conductor 21 is exposed to the outside entirely or partially from the sealing resin 16. In this configuration, since the sealing resin is not provided outside the thermal conductor 21, the heat diffusion efficiency is improved.

Figure 8A:
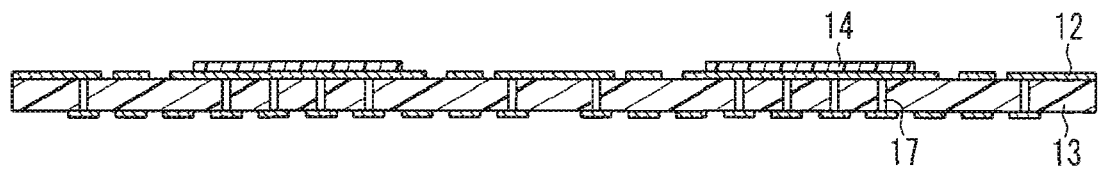
FIGS. 8A-8F are cross-sectional views showing a process of manufacturing the semiconductor device.
Figure 8B:
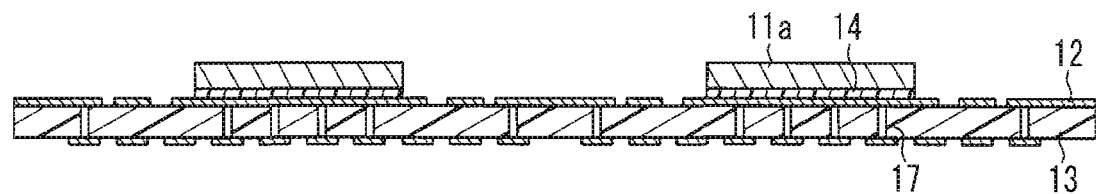
Figure 8C:
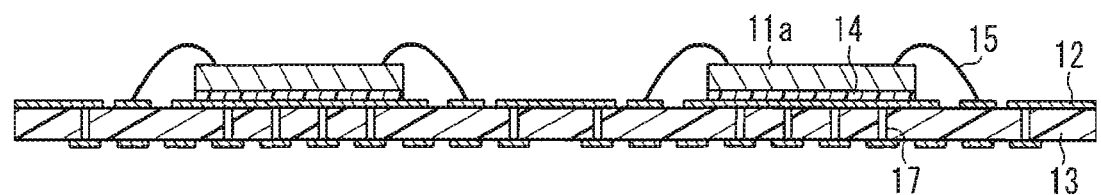

Next, a method for manufacturing the semiconductor device 2*a* in the present embodiment will be described. FIGS. 8A-8F are cross-sectional views showing the process of manufacturing the semiconductor device 2*a*. First, as shown in FIG. 8A, a substrate 13 with wiring patterns 12 formed on both the surfaces is prepared, and an adhesive 14 is applied on the predetermined positions of the semiconductor-element-mounting surface of the substrate 13. Next, as shown in FIG. 8B, the semiconductor elements 11*a* are arranged on the adhesive 14 applied on the predetermined positions of the substrate 13, and adhered securely. Next, as shown in FIG. 8C, electrodes of the semiconductor elements 11*a* mounted on the substrate 13 are connected electrically to the wiring pattern 12 formed on the semiconductor-element-mounting surface of the substrate 13 through the metal thin wires 15. The process up to this step is common to the process in the method for manufacturing the conventional semiconductor device 101 as shown in FIGS. 19A-19C.

Figure 8D:
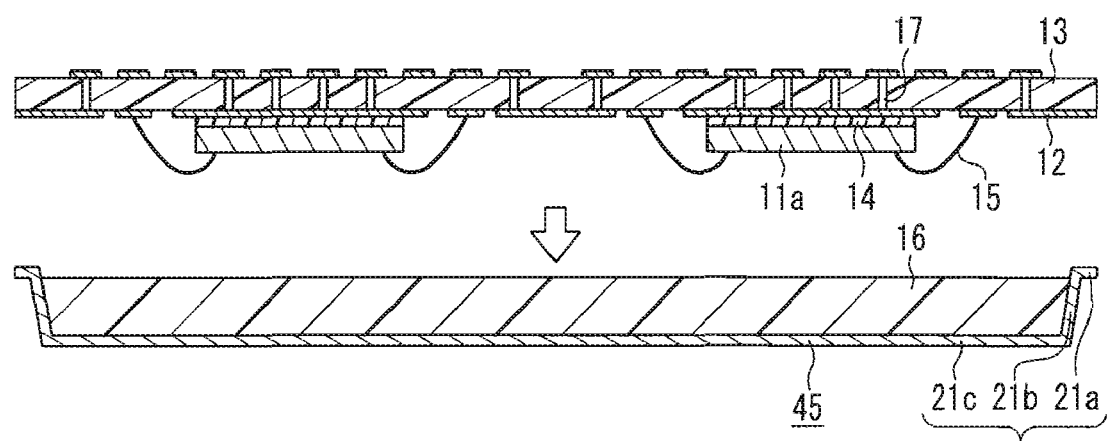

Next, a thermal conductor group 45 as shown in FIG. 8D is prepared by integrally forming a plurality of thermal conductors 21. The thermal conductor group 45 is formed by etching or pressing a metal plate made of a material having a preferable thermal conductivity, such as Cu, Cu alloy, Al, Al alloy and Fe—Ni alloy so as to form a concavity integrally. The concavity of the thermal conductor 21 is shaped to cover the plural semiconductor elements 11*a*.

Next, as shown in FIG. 8D, the sealing resin 16 is injected into the concavity of the thermal conductor group 45 in a state where the thermal conductor group 45 is placed so that the surface facing the semiconductor elements 11*a* is turned upward. At this time, for the sealing resin 16, a liquid resin is injected. Alternatively, a solid resin is cast and heated to be melted in the concavity of the thermal conductor group 45. Here, the semiconductor-element-mounting surface of the substrate 13 is turned downward, and the substrate 13 and the contact portion 21*a* are brought into contact with each other while dipping the semiconductor elements 11*a* in the liquid resin 16, and thus a resin-sealing is carried out.

Since the thermal conductor group 45 is employed in place of the mold 134 used in the sealing step in the method for manufacturing a conventional semiconductor device as shown in FIG. 19D, the steps shown in FIGS. 19D and 19E are combined into the step as shown in FIG. 8D, thereby decreasing the number of steps. In addition, the resin-sealing step can be carried out without using an expensive mold. Furthermore, unlike the case of resin-sealing in a side gate method, a resin will flow less, and thus problems such as deformation of the metal thin wires 15 can be suppressed.

Figure 8E:
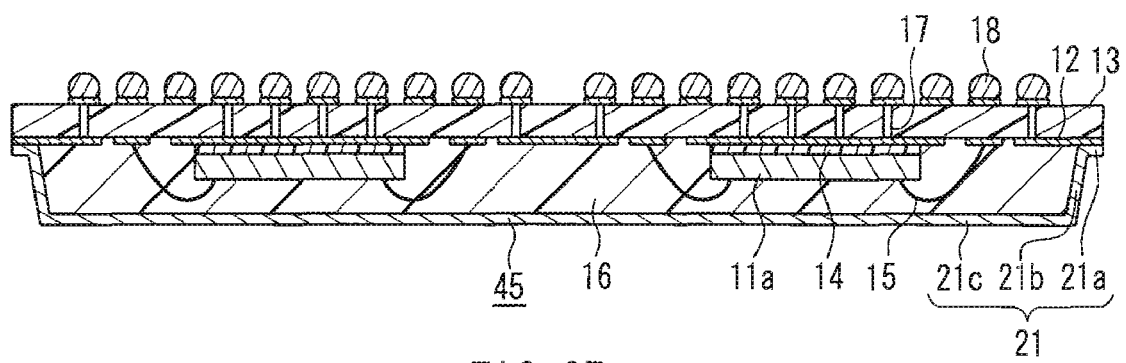
Figure 8F:
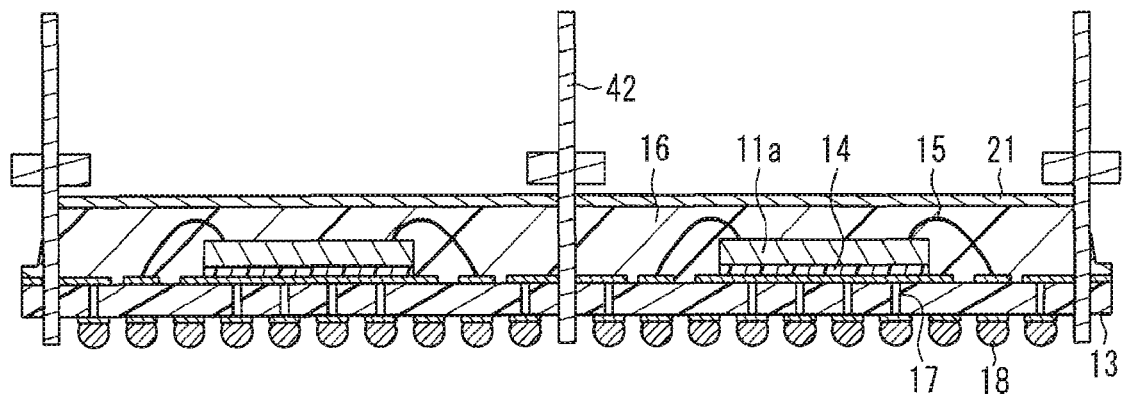

Next, as shown in FIG. 8E, the ball electrodes 18 are formed in a matrix in accordance with the wiring pattern 12 formed on the ball-formation surface of the substrate 13. Finally, as shown in FIG. 8F, the components are cut and separated with a rotary blade 42 for each of the semiconductor elements 11*a*, and thus the semiconductor device 2*a* as shown in FIG. 7 can be manufactured.

The above-described separation step in the manufacturing method relates to a case of using a substrate 13 on which the semiconductor elements 11*a* are arranged in a strip. In this case, as shown in FIG. 7, the semiconductor device 2*a* is configured so that the sealing resin is exposed from two of the side faces opposed to each other among the cross sections of the separated semiconductor devices 2a.

Figure 9A:
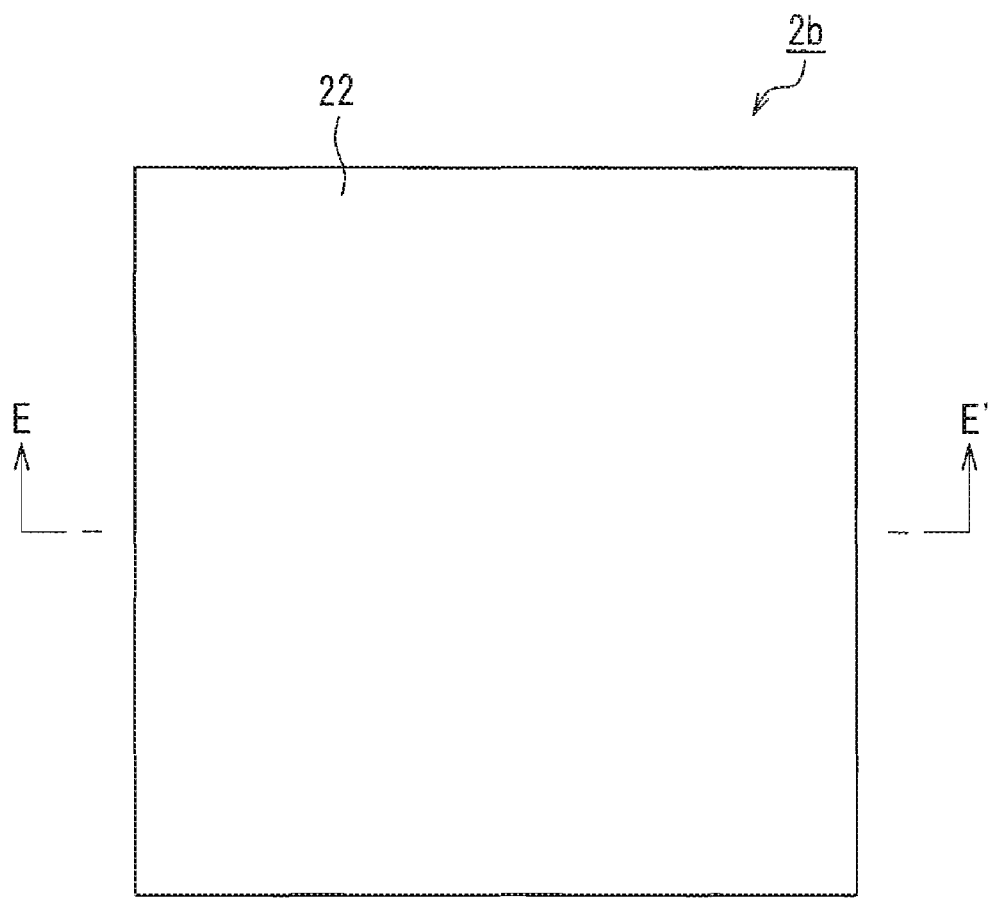
FIG. 9A is a top view showing a variation of the semiconductor device.
Figure 9B:
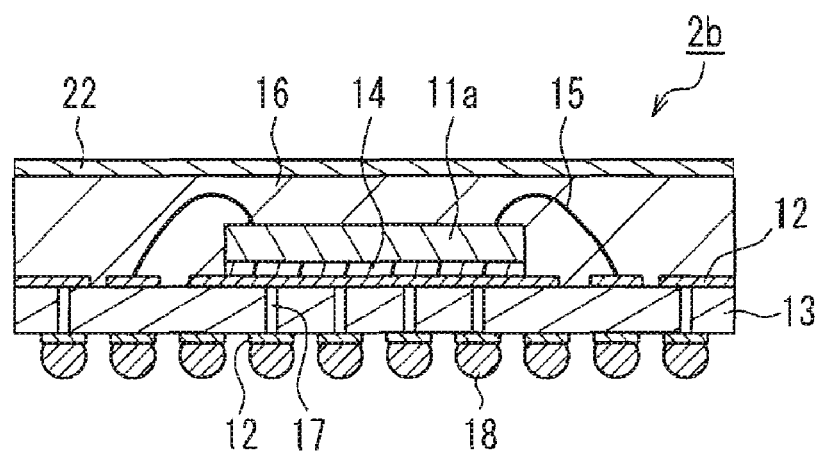
FIG. 9B is a cross-sectional view taken along the line E-E' in FIG. 9A.

FIG. 9A is a top view showing a semiconductor device 2b as a variation of the semiconductor device 2a. FIG. 9B is a cross-sectional view taken along the line E-E' in FIG. 9A. The thermal conductor 22 consists of only a flat portion, and the sealing resin 16 is exposed from all of the side faces. Even with this configuration, effects comparative to those of the semiconductor device 2b can be obtained.

The process for manufacturing the semiconductor device 2b is substantially same as the process for manufacturing the semiconductor device 2a except for the use of a thermal conductor group formed such that the flat portion is shaped to cover semiconductor chips arranged in a matrix, in the step as shown in FIG. 8D.

Embodiment 3

Figure 10A:
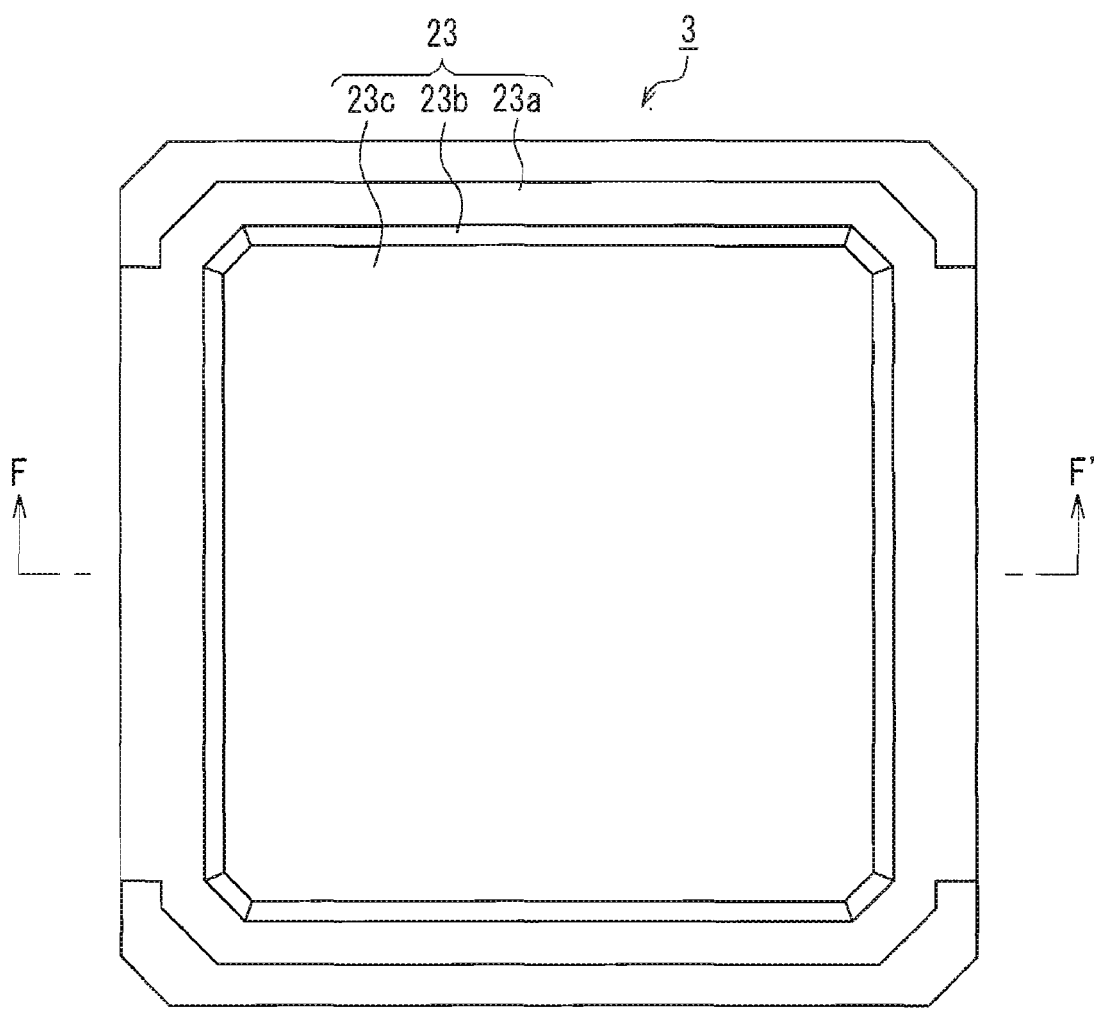
FIG. 10A is a top view showing a configuration of a semiconductor device according to Embodiment 3 of the present invention.
Figure 10B:
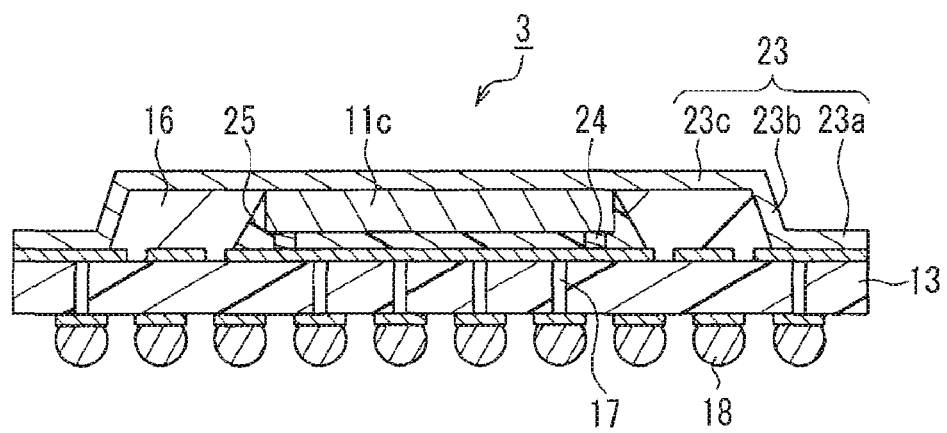
FIG. 10B is a cross-sectional view taken along the line F-F' in FIG. 10A.

A semiconductor device according to Embodiment 3 of the present invention will be described below. FIG. 10A is a top view showing a configuration of a semiconductor device 3 in Embodiment 3 of the present invention. FIG. 10B is a cross-sectional view taken along the line F-F' in FIG. 10A. In the following description of embodiment, the same reference numerals may be assigned to the same components as those of the semiconductor device 1a in Embodiment 1 in order to avoid the duplication of explanations.

A semiconductor element 11c has an electrode formed on the lower surface (circuit-formation surface). Bumps 24 connect the electrode (not shown) on the semiconductor element 11c and a wiring pattern 12 on the semiconductor-element-mounting surface of the substrate 13. The spacing between the semiconductor element 11c and the substrate 13 is filled with a resin 25, except for the region where the bumps 24 are formed.

A thermal conductor 23 is made of a material having preferable thermal conductivity, such as Cu, Cu alloy, Al, Al alloy and Fe—Ni alloy. The thermal conductor 23 includes a contact portion 23a, an inclined portion 23b formed with an inclination from the contact portion 23a, and a flat portion 23c formed continuously from the inclined portion 23b and in parallel to the contact portion 23a. The inclined portion 23b and the flat portion 23c define a concavity. The contact portion 23a is in contact with the substrate 13, and the concavity is bonded to the surface of the sealing resin 16 so as to cover the sealing resin 16.

The flat portion 23c is in contact with the upper surface of the semiconductor element 11c. The contact portion 23a may be in contact with the substrate 13 and further adhered securely to the substrate 13 with an adhesive (not shown) or the like. The flat portion 23c of the thermal conductor 23 is exposed entirely or partially to outside from the sealing resin 16.

As mentioned above, in the configuration where the flat portion 23c of the thermal conductor 23 and the upper surface of the semiconductor element 11c are in contact with each other, the heat generated at the semiconductor element 11c is conducted efficiently to the thermal conductor 23, and thus the heat diffusion efficiency at the semiconductor element 11c is improved. Moreover, since the sealing resin is not provided outside the thermal conductor 23, the heat diffusion efficiency is improved further. The heat diffusion efficiency at the semiconductor element 11c can be improved even further by providing a heat sink or the like at the flat portion 23c.

Unlike the conventional semiconductor device, the semiconductor device according to the present embodiment does not need holes formed in the thermal conductor in order to inject a sealing resin, and thus the effect of suppressing electromagnetic noise that is received or emitted by the semiconductor device.

Figure 11A:
FIGS. 11A-11F are cross-sectional views showing a process of manufacturing the semiconductor device.
Figure 11B:
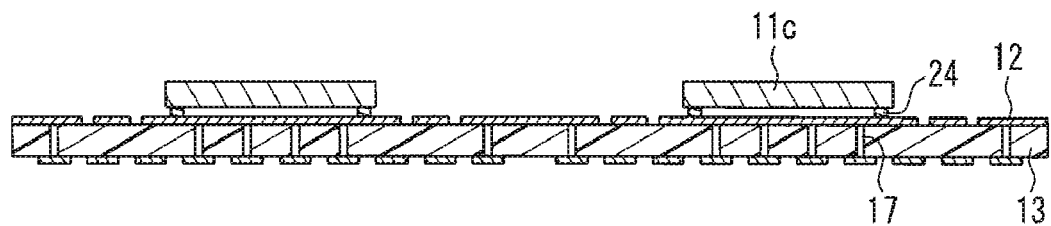
Figure 11C:
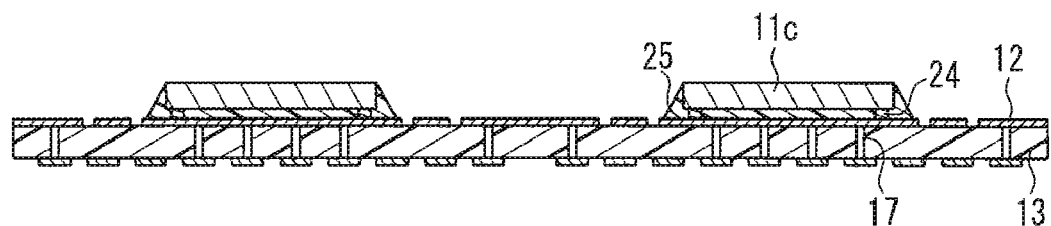

Next, a method for manufacturing the semiconductor device 3 in the present embodiment will be described with reference to the attached drawings. FIGS. 11A-11F are cross-sectional views showing the process for manufacturing the semiconductor device 3. First, as shown in FIG. 11A, the bumps 24 are formed on the electrodes of the semiconductor element 11c. Next, as shown in FIG. 11B, a substrate 13 having wiring patterns 12 formed on both the surfaces is prepared, and the semiconductor elements 11c are arranged on the predetermined positions of the semiconductor-element-mounting surface of the substrate 13 by pressing the bumps 24 on the wiring pattern 12 of the substrate 13. Next, as shown in FIG. 11C, a liquid resin 25 is injected into the space between the semiconductor elements 11c and the substrate 13 by using the capillary phenomenon.

Next, a thermal conductor group 46 consisting of a plurality of thermal conductors 23 integrally formed is prepared. The thermal conductor group 46 is formed by etching or pressing a metal plate made of a material having preferable thermal conductivity, such as Cu, Cu alloy, Al, Al alloy and Fe—Ni alloy in order to shape concavities integrally. The shape of the thermal conductor 23 is not limited to the quadrangle as shown in the present embodiment, but it can be round or polygonal. The thermal conductor group 46 is formed in accordance with the semiconductor elements arranged on the substrate 13, and it can include the thermal conductors 23 formed in a strip as shown in FIG. 3 or formed in a matrix as shown in FIG. 4.

Figure 11D:
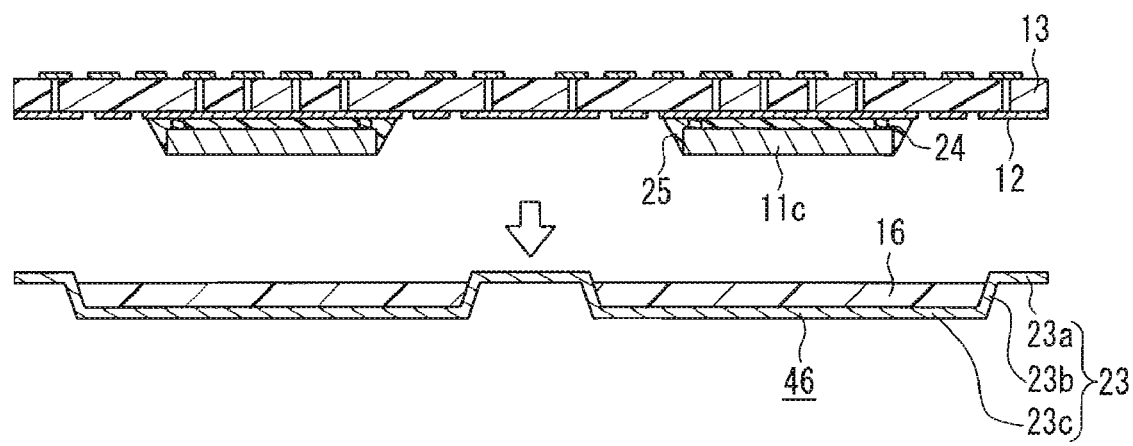

Next, as shown in FIG. 11D, in a state where the thermal conductor group 46 is set so that the surface facing the semiconductor elements 11c is turned upward, the sealing resin 16 is injected into the concavities of the thermal conductor group 46. At this time, for the sealing resin 16, a liquid resin is injected. Alternatively, a solid resin is cast and heated to be melted in the concavities of the thermal conductor group 46. Next, the surface of the substrate 13 on which the semiconductor elements 11c are mounted is turned downward, and the substrate 13 is brought into contact with the contact portion 23a of the thermal conductor 23 while dipping the semiconductor elements 11c in the liquid sealing resin 16, and thus a resin-sealing is carried out. In a case of casting a solid resin, the solid resin can be one block or more than one blocks, or a powder.

In this step, the thermal conductor group 46 is employed in place of the mold 134 used in the sealing step in the method for manufacturing a conventional semiconductor device as shown in FIG. 19D, thereby the steps shown in FIGS. 19D and 19E are combined into the step as shown in FIG. 11D, and thus the number of steps is decreased. Moreover, a resin-sealing can be carried out without using an expensive mold.

Figure 11E:
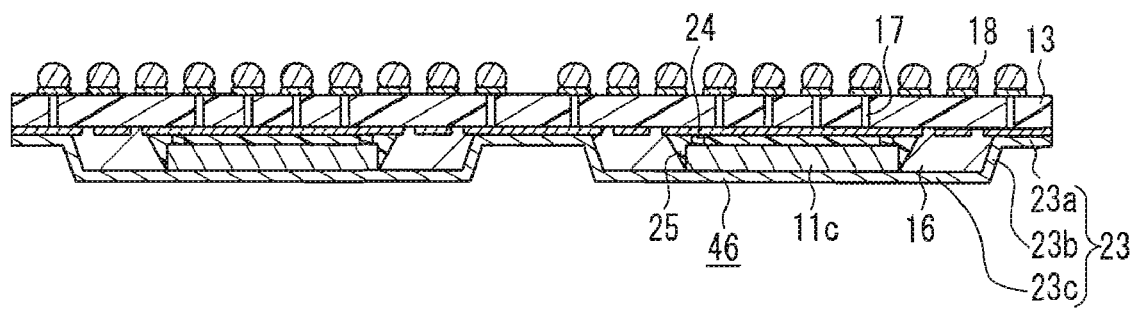
Figure 11F:
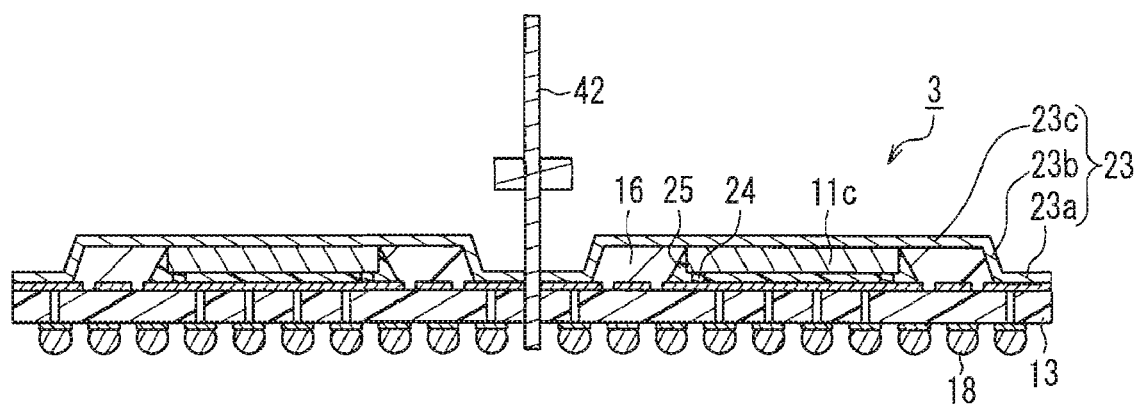

Next, as shown in FIG. 11E, the ball electrodes 18 are formed in a matrix in accordance with the wiring pattern 12 on the ball-formation surface of the substrate 13. Finally, as shown in FIG. 11F, the components are cut and separated with a rotary blade 42 for each of the semiconductor elements 11a, and thus the semiconductor device 3 as shown in FIG. 10 is manufactured.

The semiconductor device 3 in the present embodiment has an internal structure as a flip-chip package where the electrodes of the semiconductor elements 11c and the electrodes of the wiring patterns 12 are connected to each other via bumps. However, the present invention is not limited to this embodiment. The semiconductor device can be configured by using the thermal conductor 21 similar to that of Embodiment 2 so that the sealing resin is exposed from the end faces of the package.

Embodiment 4

Figure 12A:
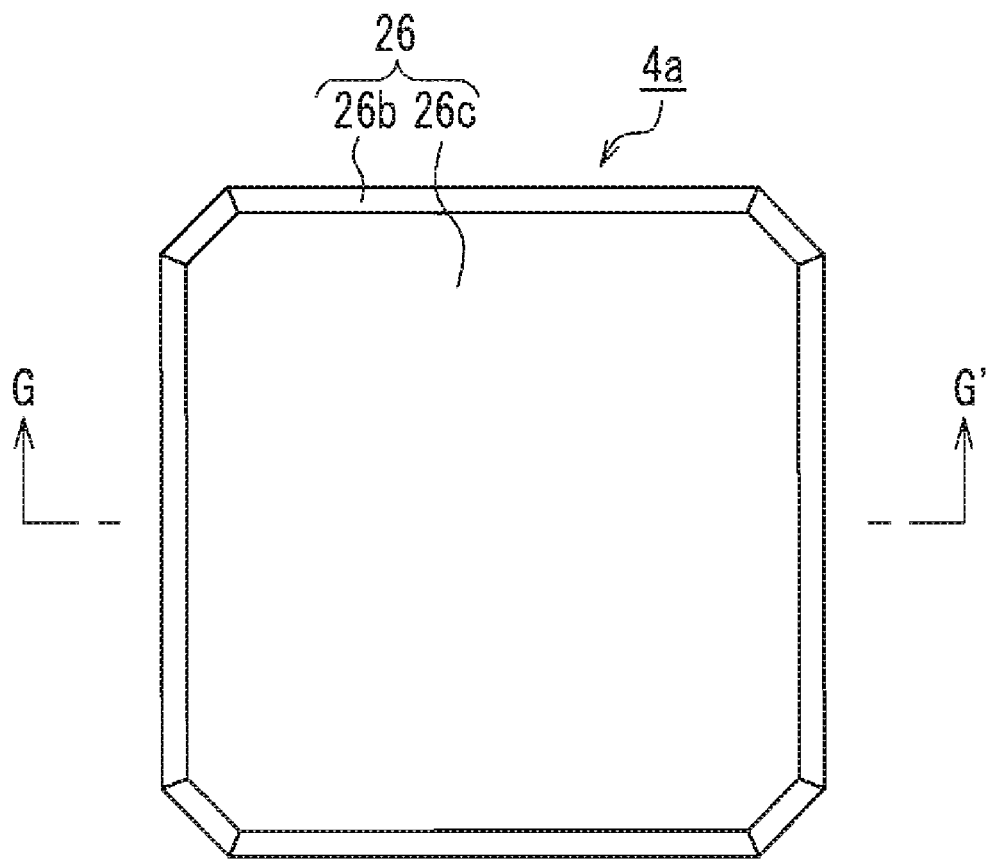
FIG. 12A is a top view showing a configuration of a semiconductor device according to Embodiment 4 of the present invention.
Figure 12B:
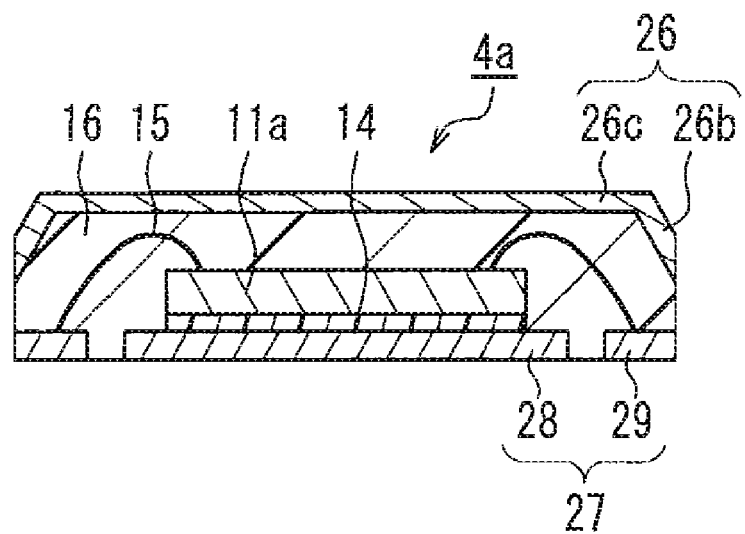
FIG. 12B is a cross-sectional view taken along the line G-G' in FIG. 12A.

A semiconductor device according to Embodiment 4 of the present invention will be described below. FIG. 12A is a top view showing a configuration of a semiconductor device 4a in Embodiment 4 of the present invention. FIG. 12B is a cross-sectional view taken along the line G-G' in FIG. 12A. In the following description of embodiment, the same reference numerals may be assigned to the same components as those of the semiconductor device 1a in Embodiment 1 in order to avoid the duplication of explanations.

A lead frame 27 for inputting/outputting from/to the exterior includes a die pad portion 28 and a lead portion 29. On the die pad portion 28, a semiconductor element 11a is arranged through an adhesive 14. The lead portion 29 is connected to an electrode on the upper surface of the semiconductor element 11a through a metal thin wire 15.

The thermal conductor 26 is made of a material having a preferable thermal conductivity, such as Cu, Cu alloy, Al, Al alloy and Fe—Ni alloy, and arranged to cover the sealing resin 16. The thermal conductor 26 includes a flat portion 26c and an inclined portion 26b formed with an inclination from the flat portion 26c. The inclined portion 26b and the flat portion 26c define a concavity. The concavity of the thermal conductor 26 is adhered to the surface of the sealing resin 16 so as to cover the sealing resin 16. The thermal conductor 26 is adhered to the lead frame 27 through the sealing resin 16. The flat portion 26c of the thermal conductor 26 is exposed entirely or partially to the exterior from the sealing resin 16. In this configuration, since the sealing resin is not provided outside the thermal conductor 26, the heat diffusion efficiency is improved.

Unlike the conventional semiconductor device, the semiconductor device according to the present embodiment does not need holes formed in the thermal conductor in order to inject a sealing resin, and thus the effect of suppressing electromagnetic noise that is received or emitted by the semiconductor device will be improved.

Next, a method for manufacturing the semiconductor device 4a in the present embodiment will be described below. FIGS. 13A-13F are cross-sectional views showing the process for manufacturing the semiconductor device 4a.

Figure 13A:
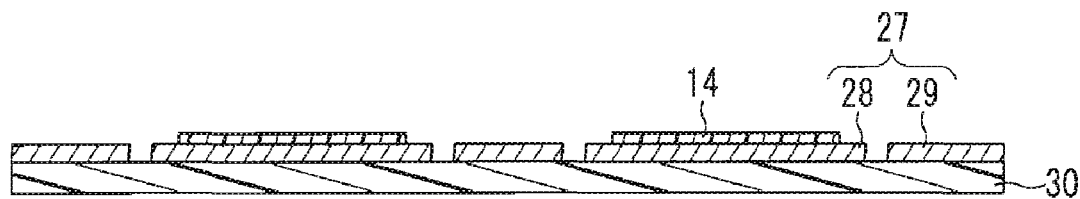
FIGS. 13A-13F are cross-sectional views showing a process of manufacturing the semiconductor device.
Figure 13B:
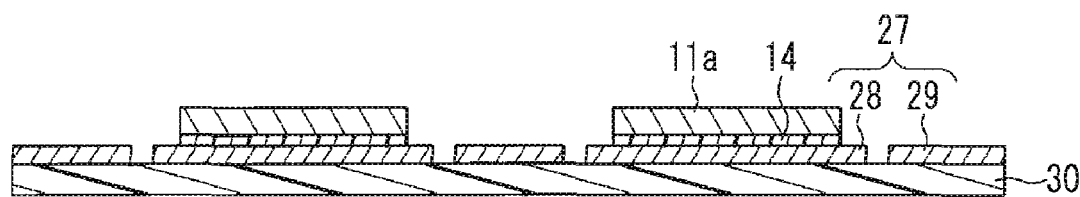
Figure 13C:
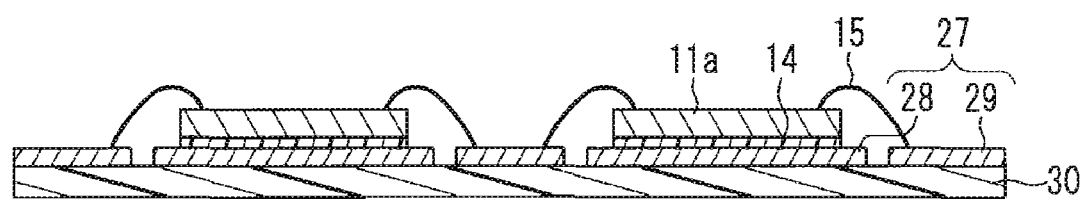

First, as shown in FIG. 13A, a tape 30 is stuck to a lead frame 27 including a die pad portion 28 on which semiconductor elements are mounted and a lead portion 29, on the surface opposite to the semiconductor-element-mounting surface. Next, an adhesive 14 is applied on the semiconductor-element-mounting surface of the die pad portion 28. Next, as shown in FIG. 13B, the semiconductor element 11a is arranged and adhered securely on the adhesive 14 applied on the die pad portion 28. Next, as shown in FIG. 13C, electrodes on the upper surface of the semiconductor element 11a mounted on the adhesive 14 and the lead portion 29 are connected electrically to each other through the metal thin wires 15.

Figure 13D:
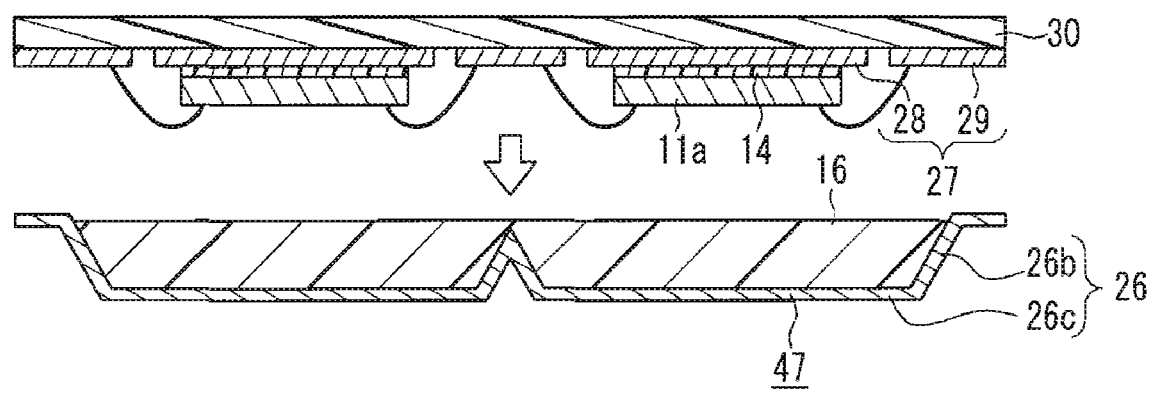

Next, a thermal conductor group 47 as shown in FIG. 13D is prepared by integrating a plurality of thermal conductors 26. The thermal conductor group 47 is formed by etching or pressing a metal plate made of a material having preferable thermal conductivity, such as Cu, Cu alloy, Al, Al alloy and Fe—Ni alloy in order to shape a plurality of concavities for covering a plurality of semiconductor elements 11a. For facilitating a subsequent step of cutting to each semiconductor element, the inclined portions 26b of the semiconductor devices to be separated are joined to form a groove in the cut region. This groove is helpful in reducing the cutting area in separating the components, thereby reducing the load applied to the semiconductor devices and to the rotary blade, and also reducing the amount of the cutting chips.

Next, as shown in FIG. 13D, the sealing resin 16 is injected into the concavities of the thermal conductor group 47 in the state where the thermal conductor group 47 is set so that the surface facing the semiconductor elements 11a is turned upward. At this time, for the sealing resin 16, a liquid resin is injected. Alternatively, a solid resin is cast and heated to be melted in the concavities of the thermal conductor group 47. In a state where the surface of the lead frame 27 on which the semiconductor elements 11a are mounted is turned downward, the lead portion 29 is brought into contact with the thermal conductor group 47 while dipping the semiconductor elements 11a in the liquid sealing resin 16, and thus a resin-sealing is carried out. In a case of casting a solid resin, the solid resin can be one block or more than one blocks, or a powder.

In this process where the thermal conductor group 47 is employed in place of the mold 134 used in the sealing step in the method for manufacturing a conventional semiconductor device as shown in FIG. 19D, the steps shown in FIGS. 19D and 19E are combined into the step as shown in FIG. 13D, thereby decreasing the number of steps. In addition, the resin-sealing can be carried out without using an expensive mold. Furthermore, unlike the case of resin-sealing in a side gate method, the resin will flow less, and thus problems such as deformation of the metal thin wires 15 can be suppressed.

Figure 13E:
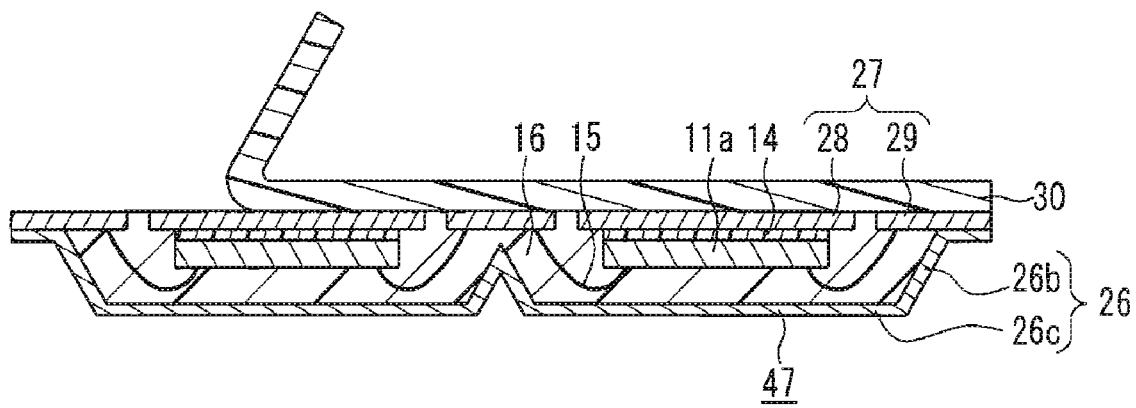
Figure 13F:
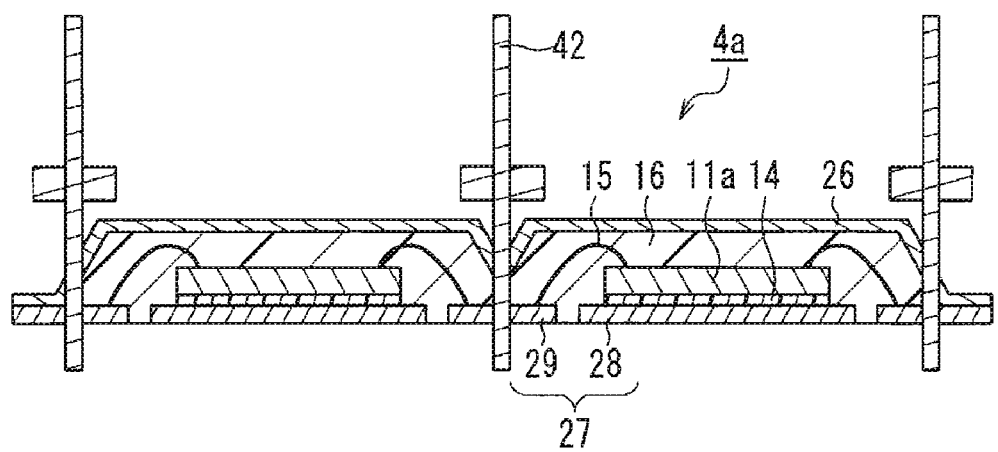

Next, as shown in FIG. 13E, the tape 30 is removed from the lead frame 27. Finally, as shown in FIG. 13F, the inclined portion 26b and the lead portion 29 are cut off with the rotary blade 42. In this manner, the semiconductor device 4a is manufactured.

Figure 14A:
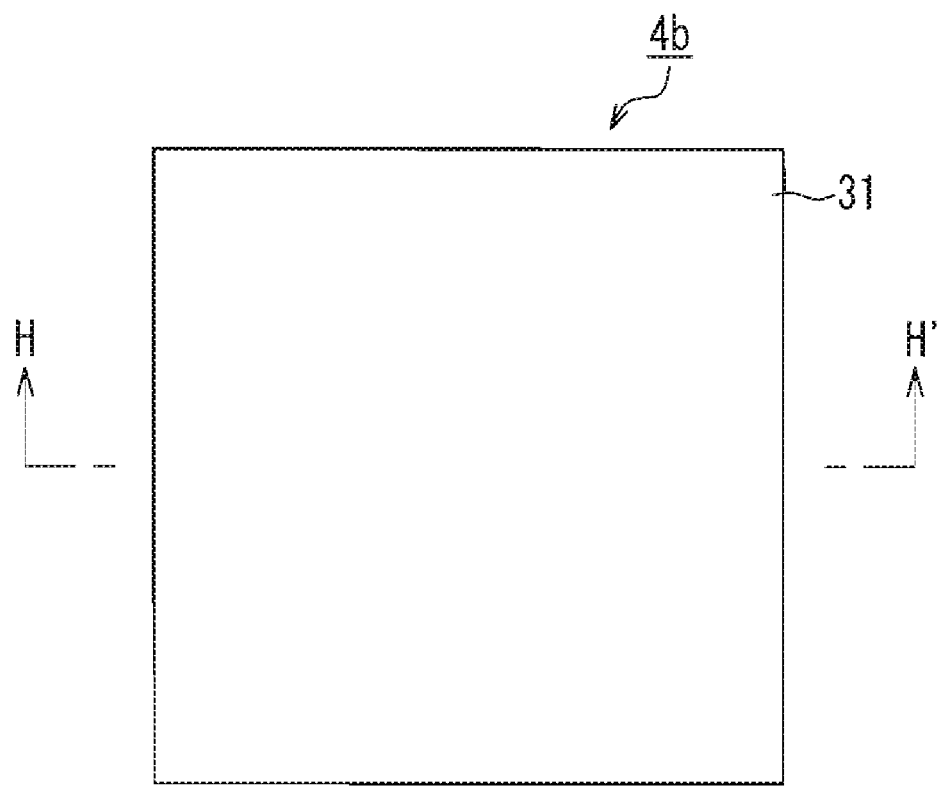
FIG. 14A is a top view showing a variation of the semiconductor device.
Figure 14B:
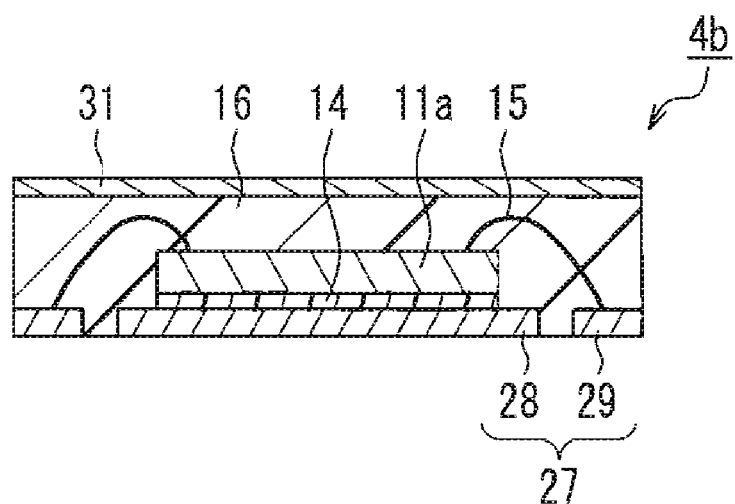
FIG. 14B is a cross-sectional view taken along the line H-H' in FIG. 14A.

Though the inclined portions 26b are provided to form grooves in the thermal conductor group 47 in this embodiment, the grooves are not formed necessarily. FIG. 14A is a top view showing a configuration of a semiconductor device 4b as a variation of the semiconductor device 4a. FIG. 14B is a cross-sectional view taken along the line H-H' in FIG. 14A. The thermal conductor 31 does not have an inclined portion. This semiconductor device 4b is obtained without forming a groove between the respective thermal conductors 31 of the thermal conductor group 47.

Unlike the semiconductor device in FIG. 12B, the semiconductor device as shown in FIG. 14B has a thermal conductor configured without any inclined portions 26b. This semiconductor device is as advantageous as the semiconductor device 4a shown in FIG. 12B in that there is no necessity of using an expensive mold and that the metal thin wires 15 are resistant to deformation.

Figure 15A:
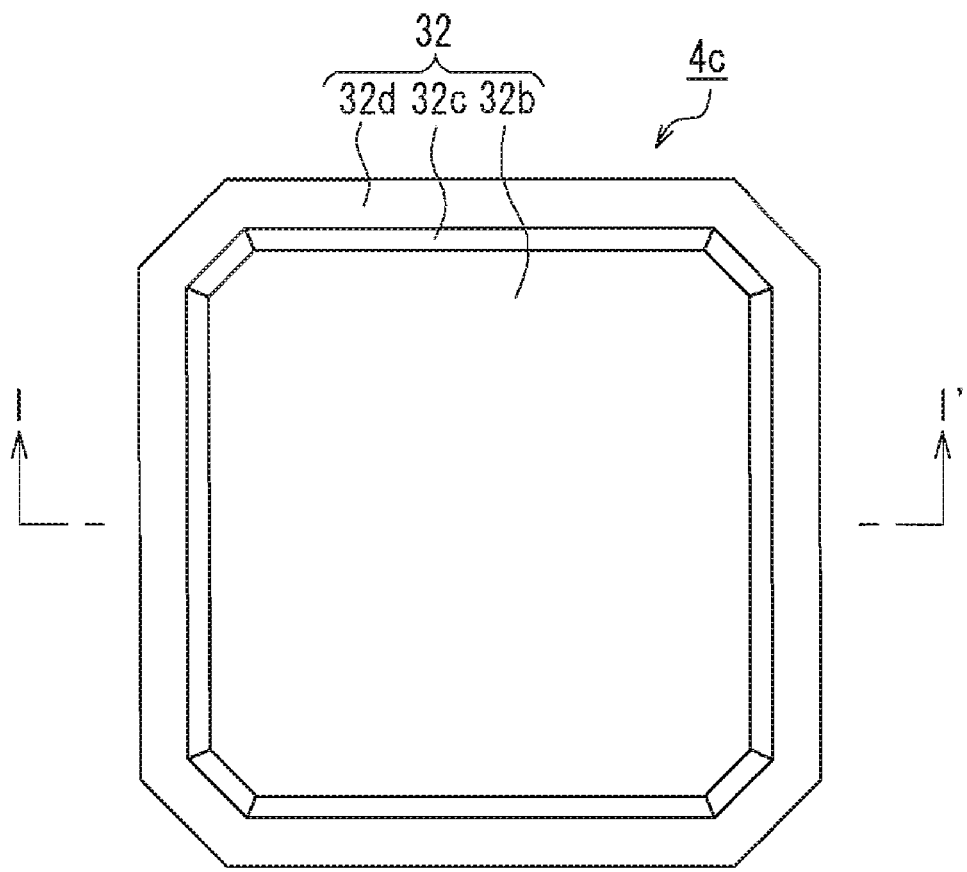
FIG. 15A is a top view showing a second variation of the semiconductor device.
Figure 15B:
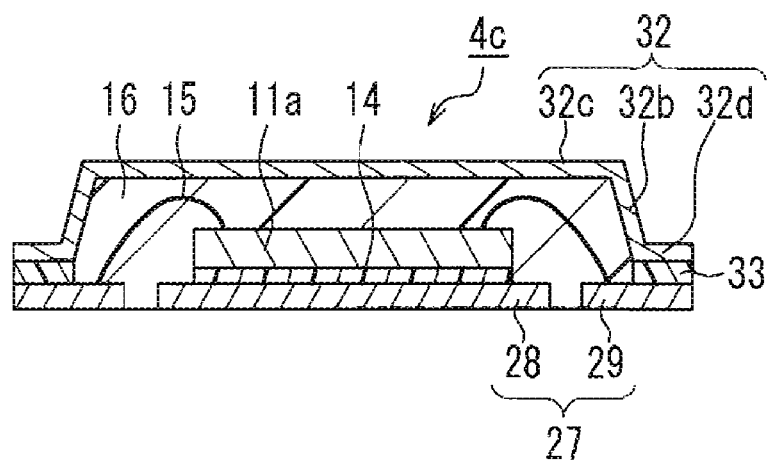
FIG. 15B is a cross-sectional view taken along the line I-I' in FIG. 15A.

When taking the heat diffusion into consideration, it is preferable that the thermal conductor 26 shown in FIG. 12B is positioned in the vicinity of the lead portion 29. FIG. 15A is a top view showing a configuration of a semiconductor device 4c as a variation of the semiconductor device 4a. FIG. 15B is a cross-sectional view taken along the line I-I' in FIG. 15A. The thermal conductor 32 has an inclined portion 32b that extends to form a peripheral flat portion 32d. The peripheral flat portion 32d is adhered to the lead portion 29 through an insulating adhesive member 33. As a result, the heat escapes from the lead portion 29 to the thermal conductor 32, and thus the heat diffusion is improved further in comparison with the semiconductor device 4a.

Figure 16:
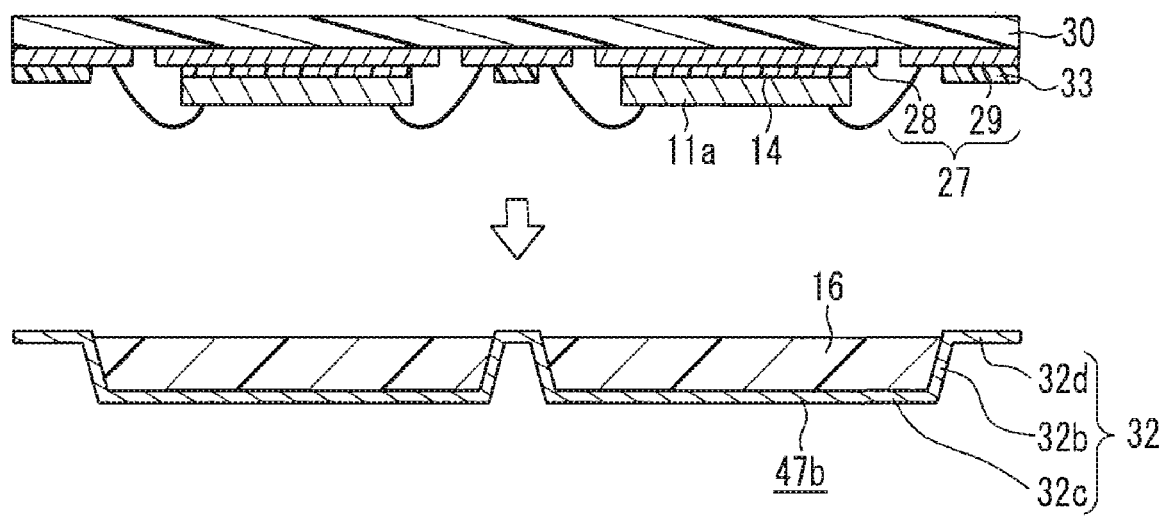
FIG. 16 is a cross-sectional view showing a process of manufacturing the second variation of the semiconductor device.
Figure 17:
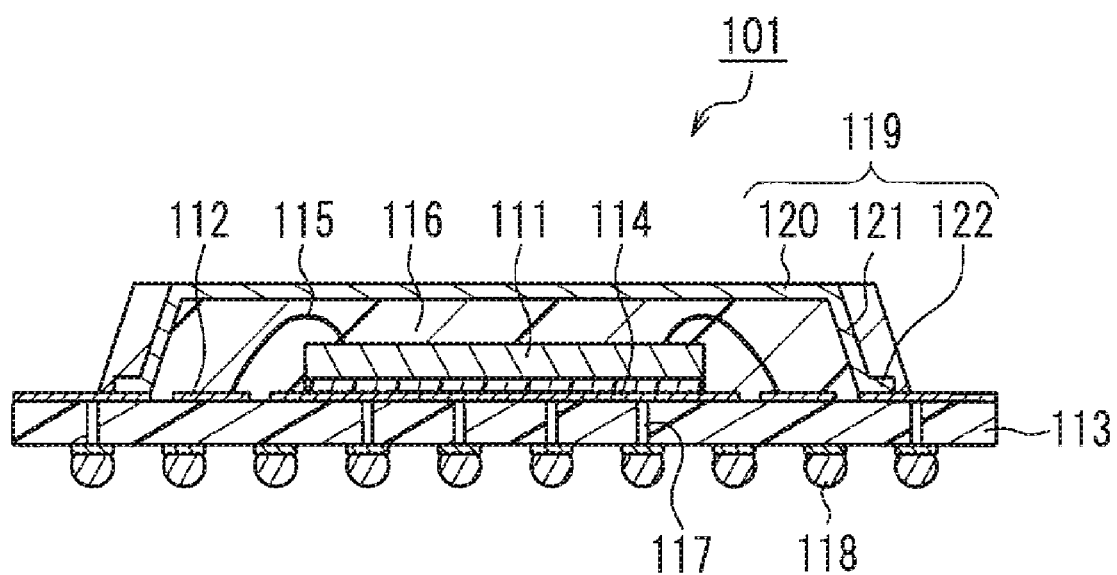
FIG. 17 is a cross-sectional view showing a configuration of a conventional semiconductor device.

The method for manufacturing the semiconductor device 4c will be described below. Explanation of the steps common to those for manufacturing the semiconductor device 4a will be omitted for avoiding the duplication of explanations. After connecting the semiconductor element 11a and the lead portion 29 as shown in FIG. 13C through the metal thin wire 15, a thermal conductor group 47b is prepared as shown in FIG. 16. The thermal conductor group 47b has a plurality of concavities, and the grooves between the concavities are flattened to form peripheral flat portions 32d.

Next, the sealing resin 16 is injected into the concavities of the thermal conductor group 47b in a state where the thermal conductor group 47b is positioned so that the surface facing the semiconductor elements 11a is turned upward. Next, in a state where the lead frame 27 is set with its surface on which the semiconductor elements 11a are mounted is turned downward, the lead portion 29 and the thermal conductor group 47b are adhered to each other through the adhesive member 33 while dipping the semiconductor elements 11a in a liquid sealing resin 16, and thus a resin-sealing is carried out. Next, the tape 30 is removed, and the thermal conductor group 47b is cut off with the rotary blade at the flat parts of the grooves. In this manner, the semiconductor device 4c is manufactured.

The semiconductor device 4c configured as shown in FIG. 15B is as advantageous as the semiconductor device 4a in that there is no necessity of using an expensive mold, and that the metal thin wires 15 are resistant to deformation.

As mentioned above, since the thermal conductors are used as the sealing molds for the semiconductor devices 1a-4c in Embodiments 1-4, the step of mounting the thermal conductor and the resin-sealing step can be carried out simultaneously, thereby reducing the number of steps. Moreover, the resin-sealing can be carried out without using an expensive sealing mold. As a result, there is no necessity of designing, manufacturing and maintaining the sealing mold, and thus the cost can be reduced remarkably. Furthermore, the size and the shape of the seal portion can be varied only by processing the thermal conductor, and thus the shape can be varied with further flexibility.

In addition, since the resin-sealing is carried out by dipping the semiconductor elements 11a and 11c in a liquid resin, deformation in the metal thin wires can be suppressed, resulting in improvement in quality.

Therefore, the present invention can provide a highly qualified semiconductor device. In other words, the semiconductor device can be shaped with less limitation, manufactured at a low cost, and it has excellent heat diffusion.

The flat portions 19c, 21c, 23c, 26c, and 32c are not necessarily flat, but can be hemispherical. However, preferably the flat portion 23 is flat since this portion is required to be in contact with the semiconductor element 11c. Similarly, it is preferable that the flat portions 19c, 21c, 23c, 26c, and 32c are flat when a heat sink or the like is provided on such a flat portion.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for manufacturing a semiconductor device, comprising:
    mounting a plurality of semiconductor elements on a substrate having wirings;
    connecting electrically electrodes of the semiconductor elements and the wirings;
    sealing the semiconductor elements with a resin, which is carried out by bringing a thermal conductor having a concavity and the substrate to be in contact with each other so that the semiconductor elements are positioned within the concavity and by filling the concavity with the resin; and
    separating the respective semiconductor elements,
    wherein in the resin-sealing step, in a state where the thermal conductor is arranged with its concavity facing up and the concavity of the thermal conductor is filled with a liquid resin, the semiconductor elements are dipped in the liquid resin in the concavity and the liquid resin is solidified.

2. The method for manufacturing a semiconductor device according to claim 1, wherein the state where the concavity of the thermal conductor is filled with the liquid resin is obtained by injecting the liquid resin into the concavity of the thermal conductor.

3. The method for manufacturing a semiconductor device according to claim 1, wherein the state where the concavity of the thermal conductor is filled with the liquid resin is obtained by casting a solid resin into the concavity of the thermal conductor and heating the thermal conductor so as to melt the solid resin.

4. The method for manufacturing a semiconductor device according to claim 1, wherein the thermal conductors before the separation step is provided as a group of joined thermal conductors, and the separation step is carried out by cutting the substrate and the thermal conductor group simultaneously.

5. The method for manufacturing a semiconductor device according to claim 4, wherein the thermal conductor group comprises the thermal conductors joined in a strip.

6. The method for manufacturing a semiconductor device according to claim 4, wherein the thermal conductor group comprises the thermal conductors joined in a matrix.

7. The method for manufacturing a semiconductor device according to claim 4, wherein the thermal conductor group has slits formed in the joints between the thermal conductors.

8. The method for manufacturing a semiconductor device according to claim 1, wherein the thermal conductor before the separation step is provided as a group of joined thermal conductors, and the separation step is carried out by cutting the substrate, the thermal conductor group and the sealing resin simultaneously.

9. The method for manufacturing a semiconductor device according to claim 8, wherein the thermal conductor group comprises the thermal conductors joined in a strip.

10. The method for manufacturing a semiconductor device according to claim 8, wherein the thermal conductor group comprises the thermal conductors joined in a matrix.

11. The method for manufacturing a semiconductor device according to claim 8, wherein the thermal conductor group has slits formed in the joints between the thermal conductors.

12. The method for manufacturing a semiconductor device according to claim 1, wherein the plural semiconductor elements are sealed simultaneously in the resin-sealing step.

13. A method for manufacturing a semiconductor device, comprising:
    mounting a plurality of semiconductor elements on a lead frame;
    connecting electrically electrodes of the semiconductor elements and the lead frame;
    sealing the semiconductor elements with a resin, which is carried out by bringing a thermal conductor having a concavity and the lead frame to be in contact with each other so that the semiconductor elements are positioned within the concavity and by filling the concavity with the resin;

separating the respective semiconductor elements, wherein in the resin-sealing step, in a state where the thermal conductor is arranged with its concavity facing up and the concavity of the thermal conductor is filled with a liquid resin, the semiconductor elements are dipped in the liquid resin in the concavity and the liquid resin is solidified.

14. The method for manufacturing a semiconductor device according to claim 13, wherein the state where the concavity of the thermal conductor is filled with a liquid resin is obtained by injecting the liquid resin into the concavity of the thermal conductor.

15. The method for manufacturing a semiconductor device according to claim 13, wherein the state where the concavity of the thermal conductor is filled with the liquid resin is obtained by casting a solid resin into the concavity of the thermal conductor and heating the thermal conductor so as to melt the solid resin.

16. The method for manufacturing a semiconductor device according to claim 13, wherein the thermal conductor before the separation step is provided as a group of joined thermal conductors, and the separation step is carried out by cutting the lead frame and the thermal conductor group simultaneously.

17. The method for manufacturing a semiconductor device according to claim 16, wherein the thermal conductor group comprises the thermal conductors joined in a strip.

18. The method for manufacturing a semiconductor device according to claim 16, wherein the thermal conductor group comprises the thermal conductors joined in a matrix.

19. The method for manufacturing a semiconductor device according to claim 16, wherein the thermal conductor group has slits formed in the joints between the thermal conductors.

20. The method for manufacturing a semiconductor device according to claim 13, wherein the thermal conductor before the separation step is provided as a group of joined thermal conductors, and the separation step is carried out by cutting the lead frame, the thermal conductor group and the solidified resin simultaneously.

21. The method for manufacturing a semiconductor device according to claim 20, wherein the thermal conductor group comprises the thermal conductors joined in a strip.

22. The method for manufacturing a semiconductor device according to claim 20, wherein the thermal conductor group comprises the thermal conductors joined in a matrix.

23. The method for manufacturing a semiconductor device according to claim 20, wherein the thermal conductor group has slits formed in the joints between the thermal conductors.

24. The method for manufacturing a semiconductor device according to claim 13, wherein the plural semiconductor elements are sealed simultaneously in the resin-sealing step.

* * * * *